(12) United States Patent
Wang et al.

(10) Patent No.: US 12,183,776 B2
(45) Date of Patent: Dec. 31, 2024

(54) METHOD FOR FORMING CAPACITOR VIA

(71) Applicant: CHANGXIN MEMORY TECHNOLOGIES, INC., Hefei (CN)

(72) Inventors: Chunyang Wang, Hefei (CN); Zhenxing Li, Hefei (CN); Bo Shao, Hefei (CN); Xinran Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

(21) Appl. No.: 17/509,167

(22) Filed: Oct. 25, 2021

(65) Prior Publication Data
US 2023/0029832 A1 Feb. 2, 2023

Related U.S. Application Data

(63) Continuation of application No. PCT/CN2021/111881, filed on Aug. 10, 2021.

(30) Foreign Application Priority Data

Jul. 30, 2021 (CN) .......................... 202110874767.7

(51) Int. Cl.
*H01L 21/311* (2006.01)
*H01L 21/66* (2006.01)
(Continued)

(52) U.S. Cl.
CPC ........ *H01L 28/40* (2013.01); *H01L 21/31144* (2013.01); *H01L 21/67242* (2013.01); *H01L 22/12* (2013.01)

(58) Field of Classification Search
CPC ......... H01L 21/31144; H01L 21/67242; H01L 22/12; H01L 28/90; H01L 21/0274;
(Continued)

(56) References Cited

U.S. PATENT DOCUMENTS 7,232,735 B2 6/2007 Ohuchi
2006/0113582 A1 6/2006 Ohuchi

FOREIGN PATENT DOCUMENTS

CN 107403723 A 11/2017
CN 111095115 A 5/2020
(Continued)

*Primary Examiner* — Shahed Ahmed
(74) *Attorney, Agent, or Firm* — Kilpatrick Townsend & Stockton LLP

(57) ABSTRACT

A method for forming a capacitor via includes: providing a to-be-processed wafer, the to-be-processed wafer including a substrate and a first dielectric layer and a first mask layer that are sequentially formed on a surface of the substrate; etching the first mask layer according to a compensated first etching parameter, to form a first patterned layer extending in a first etching direction; sequentially forming a second dielectric layer and a second mask layer on a surface of the first patterned layer; etching the second mask layer and the second dielectric layer according to a compensated second etching parameter, to form a second patterned layer extending in a second etching direction; and etching the first dielectric layer with the first patterned layer and the second patterned layer together as a capacitor pattern, to form a capacitor via.

16 Claims, 22 Drawing Sheets

(51) Int. Cl.
*H01L 21/67* (2006.01)
*H01L 49/02* (2006.01)

(58) Field of Classification Search
CPC . H01L 28/40–92; H01L 21/0273–0279; H01L 21/312–3128; H01L 21/30604–30621; H10B 12/033; H10B 12/50; H01G 4/00–40; G03F 7/004–115
See application file for complete search history.

(56) References Cited

FOREIGN PATENT DOCUMENTS

| | | | | |
|---|---|---|---|---|
| CN | 111276416 A | | 6/2020 | |
| CN | 112908881 A | | 6/2021 | |
| CN | 112967941 A | | 6/2021 | |
| CN | 113053899 A | * | 6/2021 | ....... H01L 21/31053 |
| CN | 113097141 A | | 7/2021 | |
| JP | 2006156763 A | | 6/2006 | |

* cited by examiner

METHOD FOR FORMING CAPACITOR VIA

CROSS-REFERENCE TO RELATED APPLICATIONS

This application is a continuation application of International application No. PCT/CN2021/111881, filed on Aug. 10, 2021, which claims priority to Chinese patent application No. 202110874767.7, filed Jul. 30, 2021. The disclosures of International application No. PCT/CN2021/111881 and Chinese patent application No. 202110874767.7 are hereby incorporated by reference in their entireties.

BACKGROUND

A Dynamic Random Access Memory (DRAM) stores data in the form of electric charges on a capacitor. The capacitor stores more electric charges when the capacitance is higher. At present, because capacitors have increased density and miniature sizes, many problems occur in a process of etching and manufacturing with a high aspect ratio. Especially, in a process of processing a wafer to form capacitor vias, the capacitor vias at an edge of the wafer often tilts, to cause that capacitors formed in such capacitor vias cannot be butted with a landing pad, leading to a product defect or even a risk that the capacitor collapses to short-circuit the capacitor.

SUMMARY

Embodiments of this disclosure relate to, but not limited to, a method for forming a capacitor via.

Embodiments of this disclosure provide a method for forming a capacitor via, including the following operations.

A to-be-processed wafer is provided, the to-be-processed wafer including a substrate and a first dielectric layer and a first mask layer that are sequentially formed on a surface of the substrate.

The first mask layer is etched according to a compensated first etching parameter, to form a first patterned layer extending in a first etching direction;

A second dielectric layer and a second mask layer are sequentially formed on a surface of the first patterned layer;

The second mask layer and the second dielectric layer are etched according to a compensated second etching parameter, to form a second patterned layer extending in a second etching direction; and The first dielectric layer is etched with the first patterned layer and the second patterned layer together as a capacitor pattern, to form a capacitor via.

DETAILED DESCRIPTION

The technical solutions in embodiments of this disclosure are clearly and completely described below with reference to the accompanying drawings in embodiments of this disclosure. It may be understood that the specific embodiments described herein are only used to explain the related disclosure but are not used to limit this disclosure. In addition, it further needs to be noted that only parts related to this disclosure are shown in the accompanying drawings for ease of description.

Unless otherwise defined, the technical and scientific terms used herein have the same meanings as how they are generally understood by a person skilled in the art to which this disclosure pertains. The terms used herein are merely used for describing embodiments of this disclosure, but are not intended to limit this disclosure.

In the following description, reference is made to "some embodiments", which describes a subset of all possible embodiments, but it may be understood that "some embodiments" may be the same subset or a different subset of all possible embodiments, and may be combined with each other without conflict.

It needs to noted that references to the terms "first, second, and third" in the embodiments of this disclosure are only to distinguish between similar objects and do not denote a specific order of objects. It may be understood that specific orders or sequences of "first, second, and third" may be interchanged, where appropriate, to enable embodiments of this disclosure described herein to be implemented in an order other than the order shown or described herein.

In the related art, when a wafer is processed to form a capacitor via, in a process of etching and manufacturing with high aspect ratios, for a capacitor at an edge position of the wafer, due to the consumption of an edge ring, a change occurs in a plasma sheath, especially at an RF final stage, so that plasma etching takes place in a direction perpendicular to the sheath, to cause a capacitor via formed at the edge position of the wafer to tilt. As a result, the capacitor via cannot be butted with a landing pad. Further, a capacitor formed in the capacitor via cannot be butted with the landing pad, leading to a product defect and in addition a risk that the capacitor collapses to short-circuit the capacitor.

Figure 1:
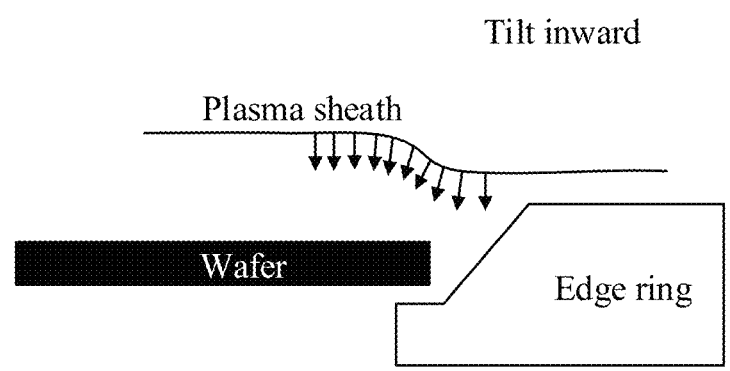
FIG. 1 is a schematic diagram of a plasma etching direction at a Radio Frequency (RF) final stage according to an embodiment of this disclosure.

Exemplarily, FIG. 1 is a schematic diagram of a plasma etching direction at an RF final stage according to an embodiment of this disclosure. As shown in FIG. 1, at the RF final stage, an edge ring carrying a wafer is consumed, so that a change occurs in a plasma sheath. As a result, plasma etching takes place in a direction perpendicular to the sheath, to cause a capacitor via at an edge of the wafer to tilt. A capacitor formed in such a capacitor via cannot be butted with a landing pad, leading to a product defect and in addition a risk of short circuit of the capacitor may be caused by the collapse of the capacitor.

Figure 2:
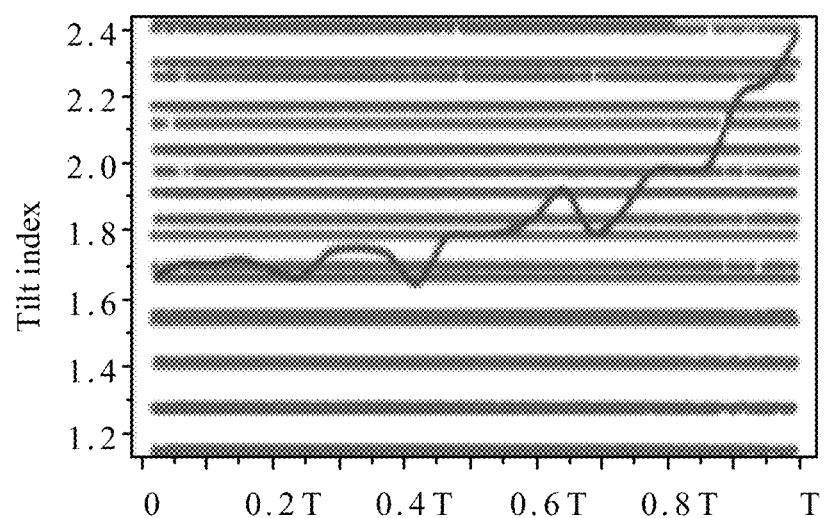
FIG. 2 is a schematic curve diagram of a relationship between a tilt index and an RF period according to an embodiment of this disclosure.

FIG. 2 is a schematic curve diagram of a relationship between a tilt index and an RF period according to an embodiment of this disclosure. As shown in FIG. 2, at an RF final stage, the tilt index clearly increases, and a tilt of a capacitor is the severest at this time.

Figure 3:
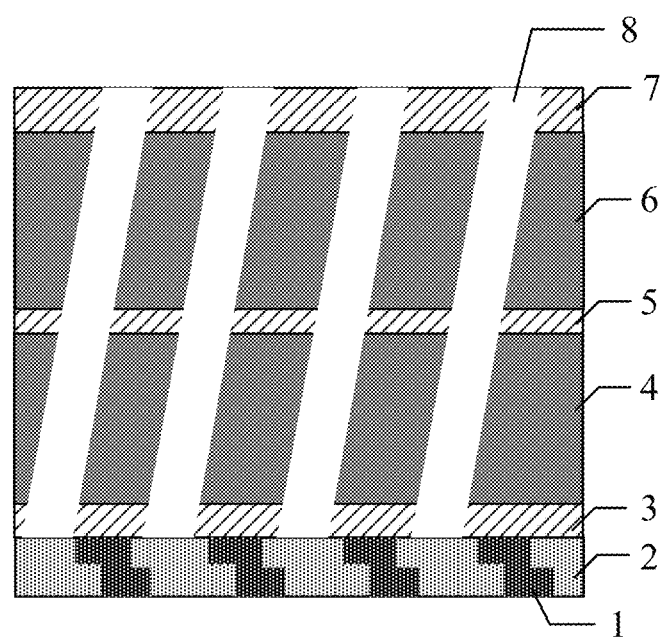
FIG. 3 is a schematic structural diagram of a capacitor via with a tilt according to an embodiment of this disclosure.

FIG. 3 is a schematic structural diagram of a capacitor via with a tilt according to an embodiment of this disclosure. As shown in FIG. 3, the structure may include a substrate 2, a landing pad 1 located in the substrate 2, a first support layer 3, a first insulating layer 4, a second support layer 5, a second insulating layer 6, a third support layer 7, and a capacitor via 8. As shown in FIG. 3, due to a deviation in an etching direction, the capacitor via 8 fails to be butted with the landing pad 1.

Based on this, to mitigate a tilt of a capacitor at an edge of a wafer, there is an urgent need for a method for mitigating a tilt of a capacitor. An overlay (OVL) error deviation is used to mitigate a tilt of a capacitor at an edge of the wafer, to form a capacitor via that successfully butted with a landing pad, so that a process window for a tilt of a capacitor can be enlarged, thereby effectively avoiding a risk that a capacitor collapses to cause a short circuit and in addition increasing a production yield.

The embodiments of the disclosure are described below in detail with reference to the accompanying drawings.

Figure 4:
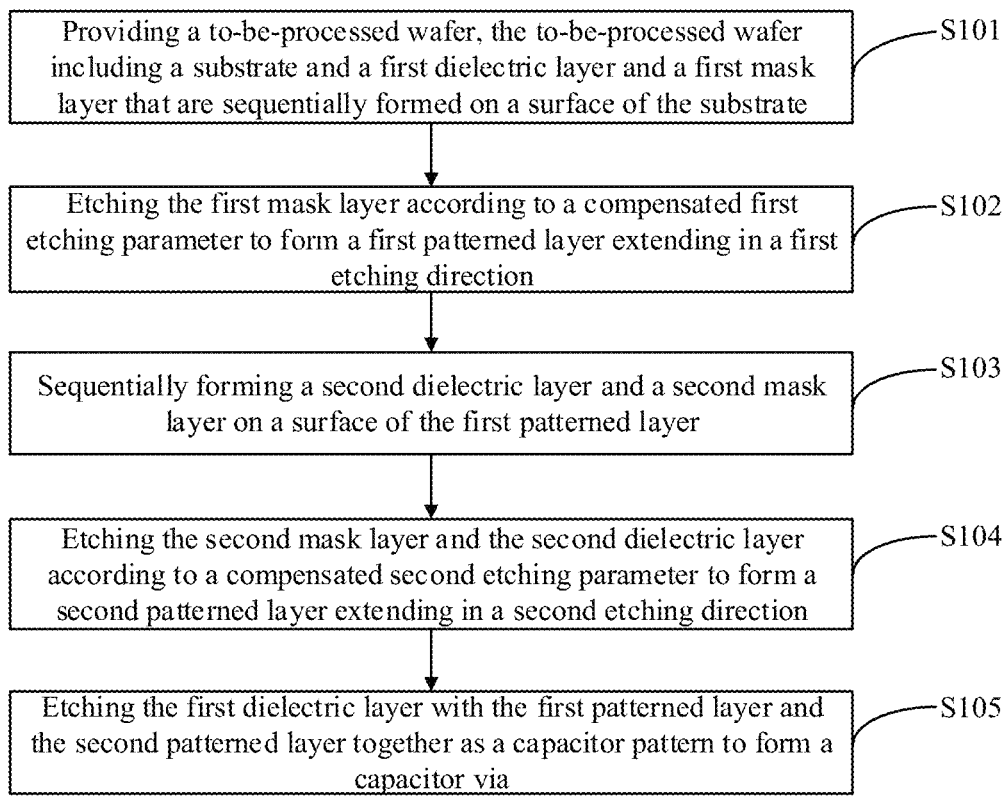
FIG. 4 is a schematic flowchart of a method for forming a capacitor via according to an embodiment of this disclosure.

In an embodiment of this disclosure, FIG. 4 is a schematic flowchart of a method for forming a capacitor via according to an embodiment of this disclosure. As shown in FIG. 4, the method may include the following operations.

In S101, a to-be-processed wafer is provided, the to-be-processed wafer including a substrate and a first dielectric layer and a first mask layer that are sequentially formed on a surface of the substrate.

Figure 5:
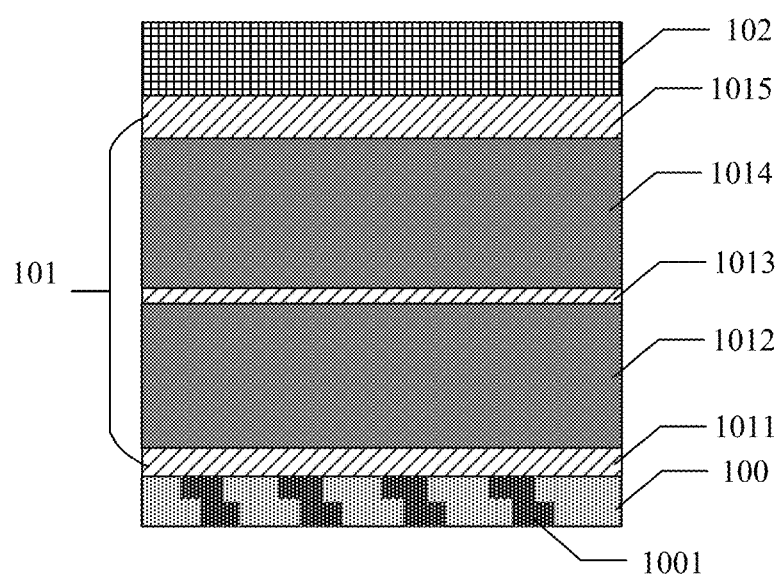
FIG. 5 is a partial schematic structural diagram of a to-be-processed wafer according to an embodiment of this disclosure.

It needs to be noted that FIG. 5 is a partial schematic structural diagram of a to-be-processed wafer according to an embodiment of this disclosure. As shown in FIG. 5, the to-be-processed wafer may include a substrate 100 and a first dielectric layer 101 and a first mask layer 102 that are sequentially formed on a surface of the substrate 100.

The substrate 100 may be a silicon substrate or another appropriate substrate material such as a silicon compound, a germanium compound or a silicon germanium compound, or another substrate known in the field. A capacitor contact structure 1001 (that is, a landing pad) is further disposed in the substrate 100, and is configured for being electrically connected to a capacitor structure formed in a capacitor via after the capacitor via is formed, thereby controlling charging and discharging of the capacitor structure. The material of the capacitor contact structure 1001 may be tungsten. There are a plurality of capacitor contact structures 1001. Two adjacent capacitor contact structures 1001 are isolated from each other by the substrate 100 or the first dielectric layer 101 therebetween.

The first dielectric layer 101 may specifically include a first support layer 1011, a first insulating layer 1012, a second support layer 1013, a second insulating layer 1014, and a third support layer 1015. Materials of the first support layer 1011, the first insulating layer 1012, and the second support layer 1013 may be selected from materials such as silicon dioxide, boron silicon nitride, and silicon nitride. For example, the material of the first support layer 1011 is selected from silicon nitride and boron silicon nitride. The material of the first insulating layer 1012 is selected from silicon dioxide. The material of the second support layer 1013 is selected from silicon nitride. Materials of the second insulating layer 1014 and the third support layer 1015 may also be selected from materials such as silicon dioxide, boron silicon nitride, and silicon nitride. For example, the material of the second insulating layer 1014 is selected from silicon dioxide. The material of the third support layer 1015 is selected from silicon nitride.

The first mask layer 102 may be formed on a surface of the first dielectric layer 101 in a deposition manner. The first mask layer 102 covers the first dielectric layer 101. The first mask layer 102 may be a single mask layer or may be a plurality of mask layers formed through multi-layer deposition. A material of the first mask layer 102 may be appropriate materials selected from polysilicon, carbon, silicon, compounds thereof and the like, such as, one or more of silicon dioxide, silicon nitride, silicon oxynitride, carbon, and the like.

It further needs to be noted that, in a process of manufacturing a semiconductor device, photolithography is an important process that transfers a pattern in a mask to a photoresist layer. As feature sizes keep decreasing, photolithography becomes increasingly difficult. Because a semiconductor base (including a metal layer and a dielectric layer) below photoresist has a relatively high reflection coefficient, an exposure light source is prone to reflection on a surface of the semiconductor substrate when a pattern is defined in the photoresist layer. As a result, the pattern in the photoresist deforms or is subject to a size deviation, leading to incorrect transfer of the pattern in the mask. To eliminate the reflection of the light source, a dielectric anti-reflective coating (DARC) is usually formed on the surface of the semiconductor substrate. A material of the DARC is generally silicon oxynitride or the like. In this way, in the embodiments of this disclosure, the first mask layer 102 may also serve as a DARC.

In S102, the first mask layer is etched according to a compensated first etching parameter, to form a first patterned layer extending in a first etching direction.

In S103, a second dielectric layer and a second mask layer are sequentially formed on a surface of the first patterned layer.

In S104, the second mask layer and the second dielectric layer are etched according to a compensated second etching parameter to form a second patterned layer extending in a second etching direction.

It needs to be noted that a machine is periodically maintained during production and manufacturing of a semiconductor. Therefore, in the embodiments of this disclosure, the RF period may be a maintenance period of the machine. A tilt of a capacitor is the severest at an RF final stage. Therefore, in the embodiments of this disclosure, the first etching parameter and the second etching parameter at the RF final stage may be compensated for, to mitigate a severe tilt of a capacitor at an edge of a wafer at the RF final stage. However, the technical solution in the embodiments of this disclosure may also be applied to a wafer etching process with a tilt of a capacitor at any period to compensate for the tilt of the capacitor, which is illustrated in detail in subsequent description of the embodiments of this disclosure.

The compensated first etching parameter is an etching parameter for forming the first patterned layer, and the compensated second etching parameter is an etching parameter for forming the second patterned layer. The first patterned layer and the second patterned layer jointly define the position of the capacitor via.

A method for determining the compensated first etching parameter and the compensated second etching parameter is described below in detail.

In some embodiments, for the compensated first etching parameter and the compensated second etching parameter, the first etching parameter and the second etching parameter of the to-be-processed wafer may be compensated for with a preset deviation amount parameter, to obtain the compensated first etching parameter and the compensated second etching parameter.

It needs to be noted that, the compensated first etching parameter and the compensated second etching parameter are obtained by compensating for an initial first etching parameter and an initial second etching parameter with the preset deviation amount parameter. With the compensation by using the preset deviation amount parameter, deviations of the capacitor via are compensated for in opposite directions of a tilt of a capacitor respectively in the first etching direction and the second etching direction. In this way, although the tilt of a capacitor cannot be avoided, it can be compensated for, so that the tilted capacitor via can be successfully butted with a capacitor contact structure.

It further needs to be noted that, the preset deviation amount parameter may be determined according to an edge deviation amount parameter of a wafer sample and a machine deviation amount parameter. Therefore, in some embodiments, the method may further include the following operations.

The edge deviation amount parameter of the wafer sample and the machine deviation amount parameter at an RF final stage are acquired.

The preset deviation amount parameter is determined according to the edge deviation amount parameter of the wafer sample and the machine deviation amount parameter.

In the embodiments of this disclosure, because the severest tilt of a capacitor occurs in an exposure unit at the edge of a wafer at the RF final stage, when determining the preset deviation amount parameter, it is necessary to consider not only the deviation of a capacitor via relative to a capacitor contact structure caused by the loss of an edge ring at the RF final stage, that is, to determine an edge deviation amount parameter of the wafer sample at the RF final stage, but also the machine deviation amount parameter fed back from machine measurement. Then the two parameters are used together to determine the preset deviation amount parameter. The edge deviation amount parameter represents a deviation amount parameter determined for the exposure unit at the edge of the wafer sample.

In some embodiments, the determining the preset deviation amount parameter according to the edge deviation amount parameter of the wafer sample and the machine deviation amount parameter may include the following operations.

An adjusted deviation amount value is determined according to an RF period and a current time.

A calculated deviation amount value is determined by using a calculation model according to the edge deviation amount parameter of the wafer sample and the machine deviation amount parameter.

The calculated deviation amount value is corrected with the adjusted deviation amount value to obtain the preset deviation amount parameter.

It needs to be noted that, although the edge deviation amount parameter of the wafer sample is determined using the wafer sample with the severest deviation at the RF final stage. During actual production, however, compensation may be performed in different RF periods to improve the production yield. Therefore, the adjusted deviation amount value is also determined from the RF period and the current time. After the calculated deviation amount value is determined according to the edge deviation amount parameter of the wafer sample and the machine deviation amount parameter, the calculated deviation amount value is corrected with the adjusted deviation amount value to obtain the preset deviation amount parameter.

The adjusted deviation amount value may be determined by using the following formula:

$$k' = \frac{t}{T} \times k, \tag{1}$$

where k' represents the adjusted deviation amount value corresponding to the current time; t represents the current time, that is, a period of time elapsed after the RF is started; T represents the RF period; and k represents the adjusted deviation amount value corresponding to the RF final stage, which is defined as being between 0 and 1.

In some embodiments, the calculated deviation amount value may be determined by using the following formula:

$$m_i = k \times m_{wafer_i} + m_{ovl} \tag{2},$$

where $m_i$ represents the calculated deviation amount value; $M_{wafer_i}$ represents the edge deviation amount parameter of the wafer sample; and $m_{ovl}$ represents the machine deviation amount parameter.

When the calculated deviation amount value is corrected with the adjusted deviation amount value, it is only necessary to replace k in Formula (2) with k' to obtain the preset deviation amount parameter. In this way, compensation can be performed for different RF periods, and the compensation is performed in combination with the current time, thereby avoiding excessive compensation at a non-RF final stage.

It further needs to be noted that, when a wafer is processed by using photolithography to obtain a capacitor via, an area of a projection exposure unit may be referred to as a shot, that is, an exposure unit or an exposure field. In the embodiments of this disclosure, in compensation for an etching parameter, an etching parameter of each exposure unit is respectively compensated for, so that during exposure each time, the best compensation effect can be achieved for corresponding exposure units.

It further needs to be noted that a relatively severe tilt of a capacitor usually occurs in an exposure unit in a region at an edge of the wafer in a wafer, therefore, an etching parameter of an exposure unit in a region at an edge of the to-be-processed wafer is mainly compensated for in the embodiments of this disclosure.

Figure 6:
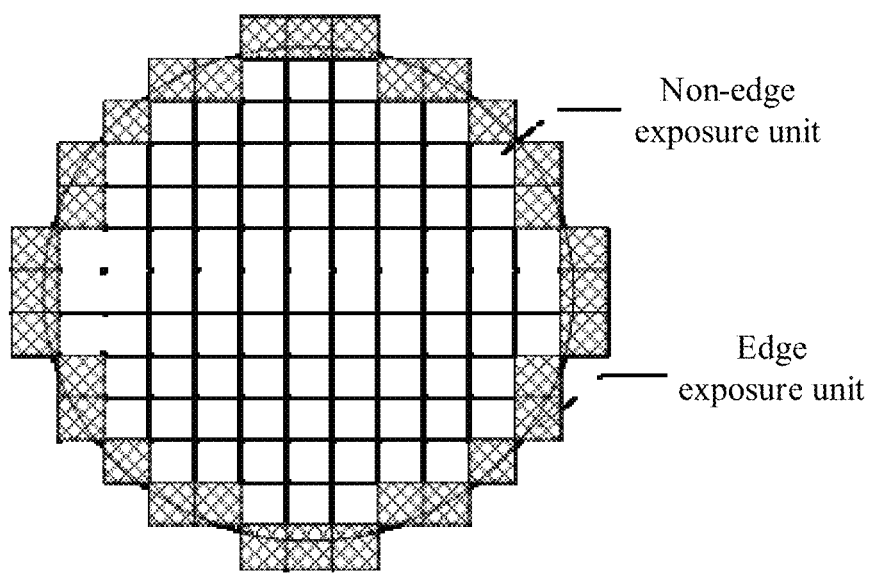
FIG. 6 is a schematic diagram of distribution of exposure units of a to-be-processed wafer according to an embodiment of this disclosure.

FIG. 6 is a schematic diagram of distribution of exposure units of a to-be-processed wafer according to an embodiment of this disclosure. As shown in FIG. 6, one square represents one exposure unit. Exposure units filled with lattice are located at edge positions of the to-be-processed wafer, and are referred to as edge exposure units. Exposure units that are not filled with lattice are located at non-edge positions of the to-be-processed wafer, and are referred to as non-edge exposure units.

In the embodiments of this disclosure, for the edge exposure units, the to-be-processed wafer may include several edge exposure units. Different edge exposure units correspond to different preset deviation amount parameters. In some embodiments, the method may further include the following operation.

A target deviation amount parameter corresponding to a target edge exposure unit of the to-be-processed wafer is determined, the target deviation amount parameter including a first target deviation amount parameter and a second target deviation amount parameter.

The operation that the first etching parameter and the second etching parameter of the to-be-processed wafer are compensated for with the preset deviation amount parameter to obtain the compensated first etching parameter and the compensated second etching parameter may include the following operations.

The first etching parameter of the target edge exposure unit is compensated for with the first target deviation amount parameter, to obtain the compensated first etching parameter.

The second etching parameter of the target edge exposure unit is compensated for with the second target deviation amount parameter, to obtain the compensated second etching parameter.

It needs to be noted that, the to-be-processed wafer in the embodiments of this disclosure includes several edge exposure units. The several edge exposure units are usually exposure units at the outermost circle of the wafer, and the edge exposure units respectively correspond to different preset deviation amount parameters.

Exposure projection once in photolithography is performed on only one exposure unit. Therefore, any edge exposure unit may be referred to as a target edge exposure unit. A preset deviation amount parameter corresponding to a target edge exposure unit is referred to as a target deviation amount parameter. In addition, during the processing of the wafer, the position of the capacitor via may be defined in two directions (that is, the first etching direction and the second etching direction). In this case, etching parameters in the two directions need to be respectively compensated for. Therefore, a target deviation amount parameter corresponding to a target edge exposure unit may include a first target deviation amount parameter and a second target deviation amount parameter.

The first target deviation amount parameter is used for compensating for the first etching parameter of the target edge exposure unit, to obtain the compensated first etching parameter. The second target deviation amount parameter is used for compensating for the second etching parameter of the target edge exposure unit, to obtain the compensated second etching parameter.

In addition, in an actual application, if the position of a capacitor via is defined in more directions, more etching parameters in the more directions may still be compensated for in the manner provided in the embodiments of this disclosure.

In some embodiments, for the first target deviation amount parameter, the method may further include the following operations.

A first edge deviation amount parameter corresponding to a target edge exposure unit of a wafer sample and a first machine deviation amount parameter in a horizontal direction at the RF final stage are acquired.

The first target deviation amount parameter is determined according to the first edge deviation amount parameter and the first machine deviation amount parameter.

In some embodiments, for the second target deviation amount parameter, the method may further include the following operations.

A second edge deviation amount parameter corresponding to the target edge exposure unit of the wafer sample and a second machine deviation amount parameter in a vertical direction at the RF final stage are acquired.

The second target deviation amount parameter is determined according to the second edge deviation amount parameter and the second machine deviation amount parameter.

It needs to be noted that, in the embodiments of this disclosure, a wafer sample in which a capacitor is formed and a tilt of a capacitor occurs may be used to determine a target deviation amount parameter of each target edge exposure unit of the to-be-processed wafer. In the embodiments of this disclosure, preferably, the wafer sample at the RF final stage is selected, because a tilt of a capacitor is the severest in the wafer sample at the RF final stage.

It further needs to be noted that, the first edge deviation amount parameter and the second edge deviation amount parameter that are directly determined from the wafer sample represent a degree of direct impact of the loss of an edge ring at the RF final stage on a tilt of a capacitor. In a process of processing a wafer, the machine also performs measurement to feed back the first machine deviation amount parameter and the second machine deviation amount parameter.

Accordingly, the first edge deviation amount parameter of the target edge exposure unit of the wafer sample (the target edge exposure unit of the wafer sample corresponds to a target edge exposure unit of the to-be-processed wafer) and the first machine deviation amount parameter in the horizontal direction are acquired for determining the first target deviation amount parameter, and the second edge deviation amount parameter of the target edge exposure unit of the wafer sample and the second machine deviation amount parameter in a vertical direction are acquired for determining the second target deviation amount parameter.

It further needs to be noted that edge deviation amount parameters determined from a wafer sample are different for different exposure units of the same wafer, while the machine deviation amount parameters fed back through the measurement of the machine are the same.

Taking the $i^{th}$ target edge exposure unit for an example, the first target deviation amount parameter and the second target deviation amount parameter may be calculated according to the following formulas:

$$x_i = k' \times x_{wafer_i} + x_{ovl}$$

$$y_i = k' \times y_{wafer_i} + y_{ovl} \qquad (3),$$

where $x_i$ represents the first target deviation amount parameter of the $i^{th}$ target edge exposure unit, that is, a value used for compensating for the first etching parameter; $x_{wafer_i}$ represents a first edge deviation amount parameter of the $i^{th}$ target edge exposure unit; and $x_{vol}$ represents the first machine deviation amount parameter.

$y_i$ represents the second target deviation amount parameter of the $i^{th}$ target edge exposure unit, that is, a value used for compensating for the second etching parameter; $y_{wafer_i}$ represents a second edge deviation amount parameter of the $i^{th}$ target edge exposure unit; $y_{vol}$ represents the second machine deviation amount parameter; and k' represents an adjusted deviation amount value corresponding to the current time, which is a coefficient for adjusting a compensation degree, and is determined by using the foregoing Formula (1).

It can be seen that Formula (3) is equivalent to the detailed description of Formula (2) in two directions.

How to determine the first edge deviation amount parameter and the second edge deviation amount parameter is further described in the embodiments of this disclosure. Specifically, in some embodiments, the method may further include the following operations.

N sampling points are randomly selected from a target edge exposure unit of the wafer sample.

First deviation amounts that respectively correspond to the n sampling points in the horizontal direction and second deviation amounts that respectively correspond to the n sampling points in the vertical direction are determined.

A first edge deviation amount parameter corresponding to the target edge exposure unit of the wafer sample is determined according to the first deviation amounts that respectively correspond to the n sampling points in the horizontal direction.

A second edge deviation amount parameter corresponding to the target edge exposure unit of the wafer sample is determined according to the second is determined that respectively correspond to the n sampling points in the vertical direction.

In some embodiments, the randomly selecting n sampling points from the target edge exposure units of the wafer sample may include the following operation.

A target edge exposure unit of the wafer sample is diced, to obtain a slice of the target edge exposure unit. The slice includes n sampling points, and each sampling point includes a capacitor contact structure and a capacitor section.

It needs to be noted that, in the embodiments of this disclosure, the slice of the target edge exposure unit of the wafer sample at the RF final stage may be obtained in a manner of polishing and slicing, and a slice of each target edge exposure unit is measured to determine the first target deviation amount parameter and the second target deviation amount parameter that correspond to the slice.

In some embodiments, the n sampling points are selected from the slice of the target edge exposure unit, and the first deviation amount in the horizontal direction and the second deviation amount in the vertical direction are respectively measured for each sampling point of the n sampling points. Each sampling point includes a capacitor contact structure and a capacitor section. The first deviation amount represents a distance by which the capacitor section deviates from the capacitor contact structure in the horizontal direction, and the second deviation amount represents a distance by which the capacitor section deviates from the capacitor contact structure in the vertical direction.

Figure 7:
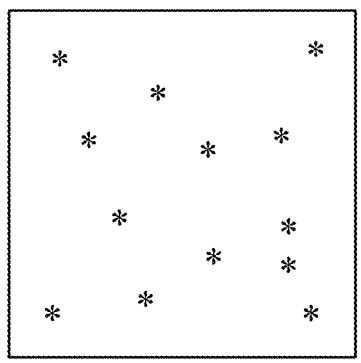
FIG. 7 is a schematic diagram of a slice of a target edge exposure unit according to an embodiment of this disclosure.

FIG. 7 is a schematic diagram of a slice of a target edge exposure unit according to an embodiment of this disclosure. As shown in FIG. 7, each "*" represents one sampling point.

In some embodiments, the determining first deviation amounts that respectively correspond to the n sampling points in the horizontal direction may include the following operations.

A first positive distance and a first negative distance between the capacitor contact structure and the capacitor section in a first sampling point are measured.

A first deviation amount of the first sampling point is calculated according to the first positive distance and the first negative distance of the first sampling point.

In some other embodiments, the determining second deviation amounts that respectively correspond to the n sampling points in the vertical direction may include the following operations.

A second positive distance and a second negative distance between the capacitor contact structure and the capacitor section in the first sampling point are measured.

A second deviation amount of the first sampling point is calculated according to the second positive distance and the second negative distance of the first sampling point.

Herein, the first sampling point represents any sampling point of the n sampling points.

Figure 8:
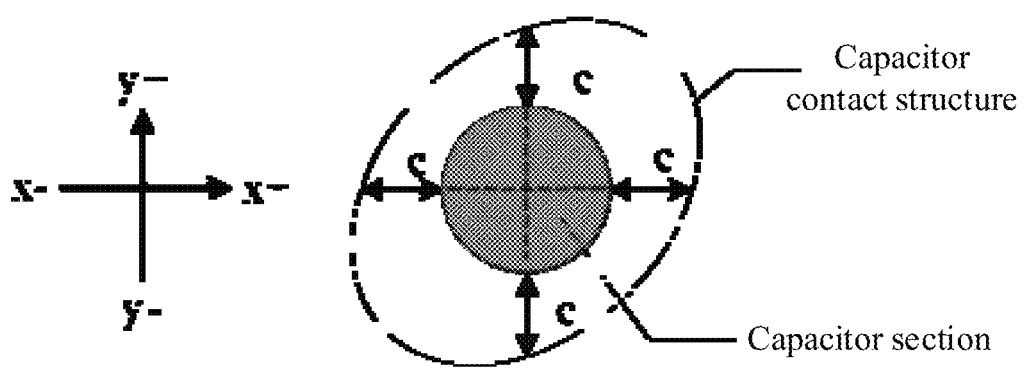
FIG. 8 is a schematic diagram of a capacitor section and a capacitor contact structure when a capacitor does not deviate according to an embodiment of this disclosure.

It may be understood that when a capacitor does not deviate, reference is made to FIG. 8 which is a schematic diagram of a capacitor section and a capacitor contact structure when a capacitor does not deviate according to an embodiment of this disclosure. As shown in FIG. 8, a region defined by an elliptical shape that is not filled with a color represents a capacitor contact structure, and a circular region filled with shade represents a capacitor section. The central point of the capacitor contact structure is referred to as the origin. In FIG. 8, a capacitor does not deviate, so the central point of the capacitor section coincides with the central point of the capacitor contact structure.

An x direction represents the horizontal direction. x+ represents a first positive direction. In a x+ direction from the origin, a distance between a right edge of the capacitor section and a right edge of the capacitor contact structure is referred to as the first positive distance. x− represents a first negative direction. In a x− direction from the origin, a distance between a left edge of the capacitor section and a left edge of the capacitor contact structure is referred to as the first negative distance.

A y direction represents a vertical direction. y+ represents a second positive direction. In a y+ direction from the origin, a distance between an upper edge of the capacitor section and an upper edge of the capacitor contact structure is referred to as the second positive distance. y− represents a second negative direction. In a y− direction from the origin, a distance between a lower edge of the capacitor section and a lower edge of the capacitor contact structure is referred to as the second negative distance.

In FIG. 8, because the capacitor does not deviate, the first positive distance, the first negative distance, the second positive distance, and the second negative distance between the edges of the capacitor section and the edges of the capacitor contact structure respectively in the x+ direction, the x− direction, the y+ direction, and the y− direction are all c. That is, deviation amount parameters of the capacitor relative to the capacitor contact structure in the horizontal direction and the vertical direction are all 0.

When the capacitor deviates, the distances between the edges of the capacitor section and the edges of the capacitor contact structure in the foregoing four directions are not necessarily c. In this case, the first positive distance, the first negative distance, the second positive distance, and the second negative distance between the capacitor contact structure and the capacitor section need to be respectively determined according to the distances between the edges of the capacitor section and the edges of the capacitor contact structure in the four directions. The first deviation amount of the first sampling point is calculated according to the first positive distance and the first negative distance. The second deviation amount of the first sampling point is calculated according to the second positive distance and the second negative distance of the first sampling point. The first deviation amount represents a deviation amount of the capacitor relative to the capacitor contact structure in the x direction, and the second deviation amount represents a deviation amount of the capacitor relative to the capacitor contact structure in the y direction.

It further needs to be noted that, when the capacitor deviates, two cases may be reflected on the slice: the capacitor section does not deviate beyond an edge of the capacitor contact structure, and the capacitor section deviates beyond an edge of the capacitor contact structure.

Therefore, in a possible embodiment, in a case that the capacitor section does not deviate beyond an edge of the capacitor contact structure, the calculating a first deviation amount of the first sampling point and a second deviation amount of the first sampling point may include the following operations.

One second of a difference between the first positive distance and the first negative distance of the first sampling point is determined as the first deviation amount of the first sampling point.

One second of a difference between the second positive distance and the second negative distance of the first sampling point is determined as the second deviation amount of the first sampling point.

Figure 9:
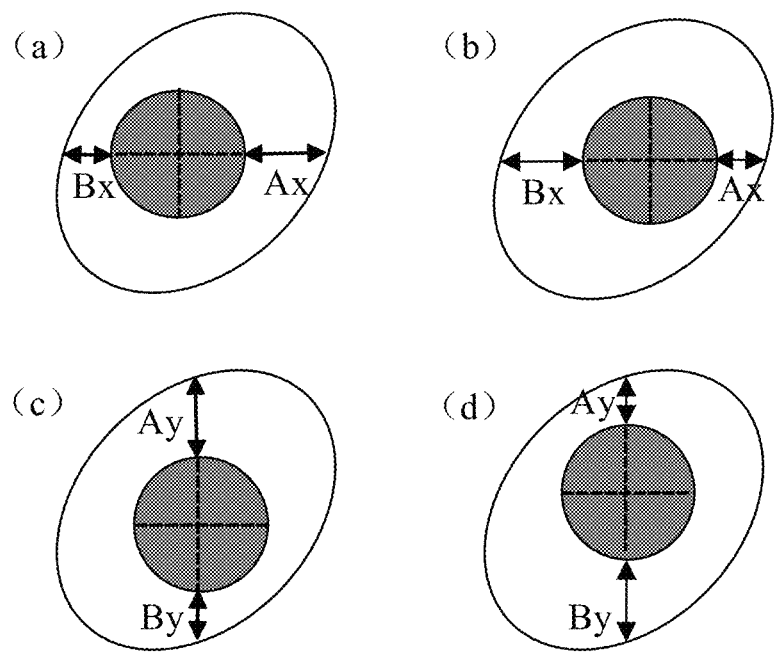
FIG. 9 is a schematic diagram of a capacitor section and a capacitor contact structure when a capacitor deviates according to an embodiment of this disclosure.

As an example, FIG. 9 is a schematic diagram of a capacitor section and a capacitor contact structure when a capacitor deviates. Referring to (a) in FIG. 9, in the x direction, the capacitor deviates in the x− direction. A method for calculating the distance between the right edge of the capacitor section and the right edge of the capacitor contact structure in the x+ direction and the distance between the left edge of the capacitor section and the left edge of the capacitor contact structure in the x− direction may be shown by the following formulas:

$$A_x = c + x$$

$$B_x = c - x \quad (4)$$

where $A_x$ represents the distance between the right edge of the capacitor section and the right edge of the capacitor contact structure in the x+ direction, that is, the first positive distance; $B_x$ represents the distance between the left edge of the capacitor section and the left edge of the capacitor contact structure in the x− direction, that is, the first negative distance; and c represents a distance between an edge of the capacitor section and an edge of the capacitor contact structure in a case that no deviation occurs, and x represents a deviation amount of the capacitor in the x direction, that is, the first deviation amount.

Formulas (4) are solved to obtain: $A_x - B_x = 2x$, so that $$x = \frac{A_x - B_x}{2}.$$

That is, the first deviation amount is one second of the difference obtained by subtracting the first negative distance from the first positive distance.

Referring to (b) in FIG. 9, in the x direction, the capacitor deviates in the x+ direction. A manner of calculating the distance between the right edge of the capacitor section and the right edge of the capacitor contact structure in the x+ direction and the distance between the left edge of the capacitor section and the left edge of the capacitor contact structure in the x− direction may be shown by the following formulas:

$$A_x = c - x$$

$$B_x = c + x \quad (5)$$

where $A_x$ represents the distance between the right edge of the capacitor section and the right edge of the capacitor contact structure in the x+ direction, that is, the first positive distance; $B_x$ represents the distance between the left edge of the capacitor section and the left edge of the capacitor contact structure in the x− direction, that is, the first negative distance; and c represents a distance between an edge of the capacitor section and an edge of the capacitor contact structure in a case that no deviation occurs, and x represents a deviation amount of the capacitor in the x direction, that is, the first deviation amount.

Formulas (5) are solved to obtain: $B_x - A_x = 2x$, so that $$x = \frac{B_x - A_x}{2};$$

that is, the first deviation amount is one second of the difference obtained by subtracting the first positive distance from the first negative distance.

That is, in a case that the capacitor section does not deviate beyond an edge of the capacitor contact structure, the first deviation amount is equal to one second of an absolute value of the difference between the first positive distance and the first negative distance.

Referring to (c) in FIG. 9, in the y direction, the capacitor deviates in the y− direction. A manner of calculating the distance between the upper edge of the capacitor section and the upper edge of the capacitor contact structure in the y+ direction and the distance between the lower edge of the capacitor section and the lower edge of the capacitor contact structure in the y− direction may be shown by the following formulas:

$A_y = c+y$ $B_y = c-y$ (6)

where $A_y$ represents the distance between the upper edge of the capacitor section and the upper edge of the capacitor contact structure in the y+ direction, that is, the second positive distance; $B_y$ represents the distance between the lower edge of the capacitor section and the lower edge of the capacitor contact structure in the y− direction, that is, the second negative distance; and c represents a distance between an edge of the capacitor section and an edge of the capacitor contact structure in a case that no deviation occurs, and y represents the deviation amount of the capacitor in the y direction, that is, the second deviation amount.

Formulas (6) are solved to obtain: $A_y - B_y = 2y$, so that $$y = \frac{A_y - B_y}{2};$$

that is, the second deviation amount is one second of the difference obtained by subtracting the second negative distance from the second positive distance.

Referring to (d) in FIG. 9, in the y direction, the capacitor deviates in the y+ direction. A manner of calculating the distance between the upper edge of the capacitor section and the upper edge of the capacitor contact structure in the y+ direction and the distance between the lower edge of the capacitor section and the lower edge of the capacitor contact structure in the y− direction may be shown by the following formulas:

$A_y = c-y$ $B_y = C+y$ (7)

where $A_y$ represents the distance between the upper edge of the capacitor section and the upper edge of the capacitor contact structure in the y+ direction, that is, the second positive distance; $B_y$ represents the distance between the lower edge of the capacitor section and the lower edge of the capacitor contact structure in the y− direction, that is, the second negative distance; and c represents a distance between an edge of the capacitor section and an edge of the capacitor contact structure in a case that no deviation occurs, and y represents the deviation amount of the capacitor in the y direction, that is, the second deviation amount.

Formulas (7) are solved to obtain: $B_y - A_y = 2y$, so that $B_y - A_y = 2y$; that is, the second deviation amount is one second of the difference obtained by subtracting the second positive distance from the second negative distance.

That is, in a case that the capacitor section does not deviate beyond an edge of the capacitor contact structure, the second deviation amount is equal to one second of an absolute value of the difference between the second positive distance and the second negative distance.

Figure 10:
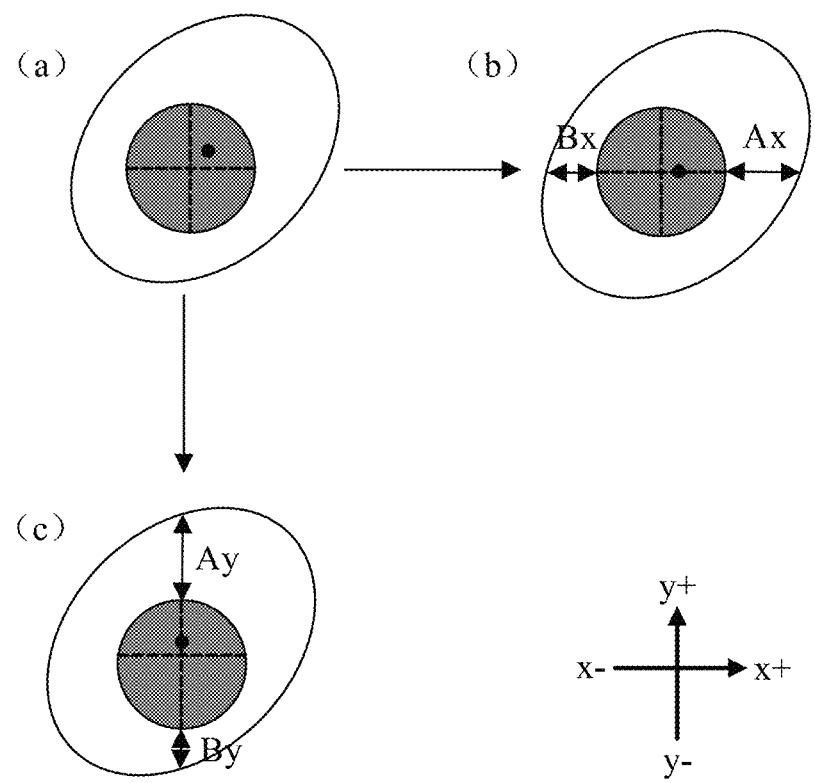
FIG. 10 is a schematic diagram of another capacitor section and another capacitor contact structure when a capacitor deviates according to an embodiment of this disclosure.

Exemplarily, FIG. 10 is a schematic diagram of another capacitor section and another capacitor contact structure when a capacitor deviates according to an embodiment of this disclosure. As shown by (a) in FIG. 10, the black dot represents the central point of the capacitor contact structure, that is, the origin. As can be seen from (a) in FIG. 10, the capacitor section deviates in the x− direction and the y− direction. The deviation amount of the capacitor section is decomposed in the x direction and the y direction, which are respectively shown by (b) and (c) in FIG. 10. In this case, the first deviation amount and the second deviation amount of the capacitor section in the x direction and the y direction are respectively determined according to the foregoing method.

In another possible embodiment, in a case that the capacitor section deviates beyond an edge of the capacitor contact structure, the calculating a first deviation amount of the first sampling point and a second deviation amount of the first sampling point may include the following operations One second of a sum of the first positive distance and the first negative distance of the first sampling point is determined as the first deviation amount of the first sampling point.

One second of a sum of the second positive distance and the second negative distance of the first sampling point is determined as the second deviation amount of the first sampling point.

Figure 11:
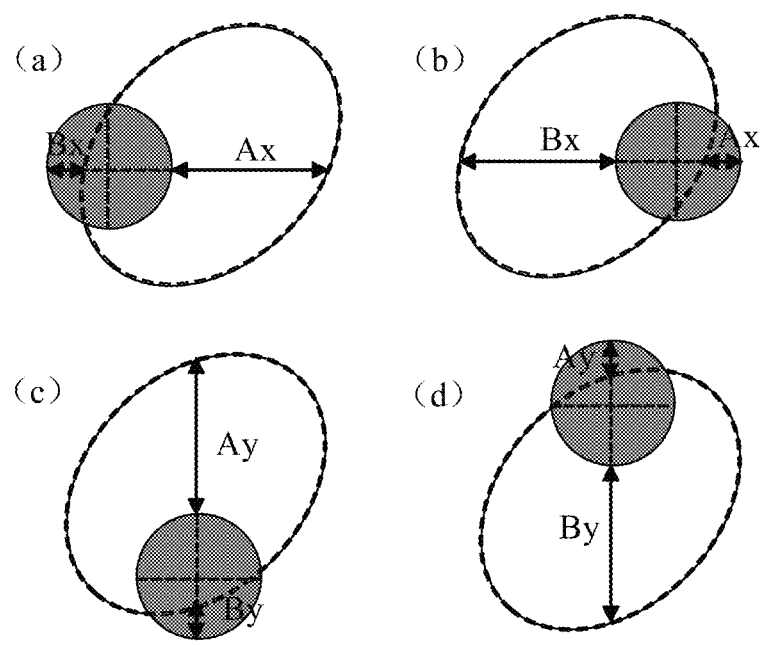
FIG. 11 is a schematic diagram of still another capacitor section and still another capacitor contact structure when a capacitor deviates according to an embodiment of this disclosure.

It needs to be noted that, as an example, FIG. 11 is a schematic diagram of still another capacitor section and still another capacitor contact structure when a capacitor deviates. Referring to (a) in FIG. 11, in the x direction, the capacitor section deviates in the x− direction. A manner of calculating the distance between the right edge of the capacitor section and the right edge of the capacitor contact structure in the x+ direction and the distance between the left edge of the capacitor section and the left edge of the capacitor contact structure in the x− direction may be shown by the following formulas:

$A_x = c+x$ $B_x = -c+x$ (8)

where $A_x$ represents the distance between the right edge of the capacitor section and the right edge of the capacitor contact structure in the x+ direction, that is, the first positive distance; $B_x$ represents the distance between the left edge of the capacitor section and the left edge of the capacitor contact structure in the x− direction, that is, the first negative distance; and c represents a distance between an edge of the capacitor section and an edge of the capacitor contact structure in a case that no deviation occurs, and x represents a deviation amount of the capacitor in the x direction, that is, the first deviation amount.

Formulas (8) are solved to obtain: $A_x + B_x = 2x$, so that $$x = \frac{A_x + B_x}{2};$$

that is, the first deviation amount is one second of the sum of the first positive distance and the first negative distance.

Referring to (b) in FIG. 11, in the x direction, the capacitor deviates in the x+ direction. A manner of calculating the distance between the right edge of the capacitor section and the right edge of the capacitor contact structure in the x+ direction and the distance between the left edge of the capacitor section and the left edge of the capacitor contact structure in the x− direction may be shown by the following formulas:

$A_x = -c+x$ $B_x = c+x$ (9)

where $A_x$ represents the distance between the right edge of the capacitor section and the right edge of the capacitor contact structure in the x+ direction, that is, the first positive distance; $B_x$ represents the distance between the left edge of the capacitor section and the left edge of the capacitor contact structure in the x− direction, that is, the first negative distance; and c represents a distance between an edge of the capacitor section and an edge of the capacitor contact structure in a case that no deviation occurs, and y represents the deviation amount of the capacitor in the y direction, that is, the second deviation amount.

Formulas (9) are solved to obtain: $A_x+B_x=2x$, so that $$x = \frac{A_x + B_x}{2};$$

that is, the first deviation amount is one second of the sum of the first positive distance and the first negative distance.

Referring to (c) in FIG. 11, in the y direction, the capacitor deviates in the y− direction. A manner of calculating the distance between the upper edge of the capacitor section and the upper edge of the capacitor contact structure in the y+ direction and the distance between the lower edge of the capacitor section and the lower edge of the capacitor contact structure in the y− direction may be shown by the following formulas:

$$A_y=c+y$$

$$B_y=-c+y \quad (10)$$

where $A_y$ represents the distance between the upper edge of the capacitor section and the upper edge of the capacitor contact structure in the y+ direction, that is, the second positive distance; $B_y$ represents the distance between the lower edge of the capacitor section and the lower edge of the capacitor contact structure in the y− direction, that is, the second negative distance; and c represents a distance between an edge of the capacitor section and an edge of the capacitor contact structure in a case that no deviation occurs, and y represents the deviation amount of the capacitor in the y direction, that is, the second deviation amount.

Formulas (10) are solved to obtain: $A_y+B_y=2y$, so that $$y = \frac{A_y + B_y}{2};$$

that is, the second deviation amount is one second of the sum obtained by adding the second positive distance to the second negative distance.

Referring to (d) in FIG. 11, in the y direction, the capacitor deviates in the y+ direction. A manner of calculating the distance between the upper edge of the capacitor section and the upper edge of the capacitor contact structure in the y+ direction and the distance between the lower edge of the capacitor section and the lower edge of the capacitor contact structure in the y− direction may be shown by the following formulas:

$$A_y=-c+y$$

$$B_y=C+y \quad (11)$$

where $A_y$ represents the distance between the upper edge of the capacitor section and the upper edge of the capacitor contact structure in the y+ direction, that is, the second positive distance; $B_y$ represents the distance between the lower edge of the capacitor section and the lower edge of the capacitor contact structure in the y− direction, that is, the second negative distance; and c represents a distance between an edge of the capacitor section and an edge of the capacitor contact structure in a case that no deviation occurs, and y represents the deviation amount of the capacitor in the y direction, that is, the second deviation amount.

Formulas (11) are solved to obtain: $B_y+A_y=2y$, so that $$y = \frac{B_y + A_y}{2};$$

that is, the second deviation amount is one second of the sum of the second negative distance and the second positive distance.

That is, in a case that the capacitor section deviates beyond an edge of the capacitor contact structure, the second deviation amount is equal to one second of the sum of the second positive distance and the second negative distance.

Figure 12:
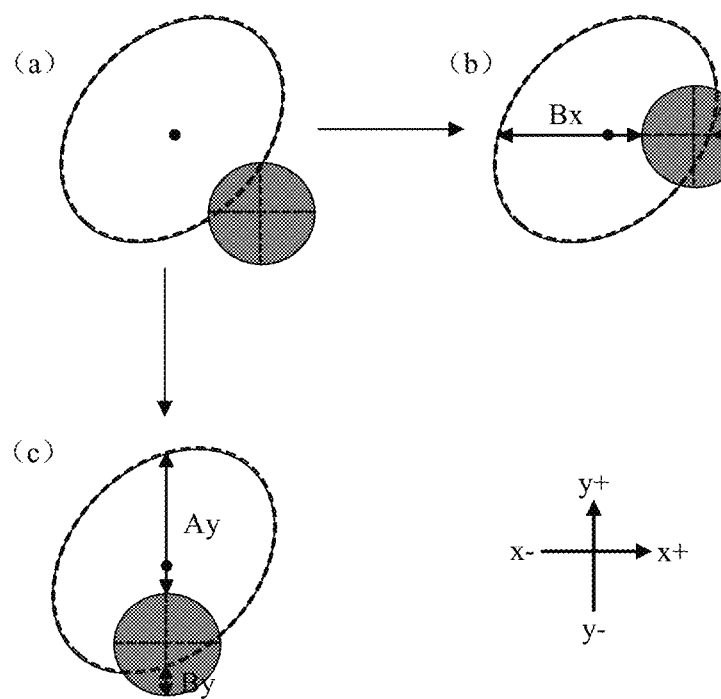
FIG. 12 is a schematic diagram of yet another capacitor section and yet another capacitor contact structure when a capacitor deviates according to an embodiment of this disclosure.

Exemplarily, FIG. 12 is a schematic diagram of yet another capacitor section and yet another capacitor contact structure when a capacitor deviates according to an embodiment of this disclosure. As shown by (a) in FIG. 12, the black dot represents the central point of the capacitor contact structure, that is, the origin. As can be seen from (a) in FIG. 12, the capacitor section deviates in the x+ direction and the y− direction. The deviation amount of the capacitor section is decomposed in the x direction and the y direction, which are respectively shown by (b) and (c) in FIG. 11. In this case, the first deviation amount and the second deviation amount of the capacitor section in the x direction and the y direction are respectively determined according to the foregoing method.

In this way, according to the foregoing embodiments, regardless of a direction in which the capacitor section deviates, the first deviation amount and the second deviation amount of the capacitor section in the horizontal direction and the vertical direction may be calculated.

In some embodiments, for any slice, a first deviation amount of each sampling point in the n sampling points in the x direction and a second deviation amount of each sampling point in the y direction may be calculated, and then a first edge deviation amount parameter and a second edge deviation amount parameter of a target edge exposure unit corresponding to the slice are calculated according to the first deviation amounts and the second deviation amounts of the n sampling points.

In addition, in the embodiments of this disclosure, the largest value and the smallest value in deviation amounts of the n sampling points may be discarded, and then the first edge deviation amount parameter and the second edge deviation amount parameter are determined.

In some embodiments, for determination of the first edge deviation amount parameter, the determining a first edge deviation amount parameter corresponding to a target edge exposure unit of the wafer sample according to the first deviation amounts that respectively correspond to the n sampling points in the horizontal direction may further include: removing the largest value and the smallest value in the first deviation amounts that respectively correspond to the n sampling points, and calculating an average of the remaining (n−2) first deviation amounts to obtain the first edge deviation amount parameter.

In some embodiments, for determination of the second edge deviation amount parameter, the determining a second edge deviation amount parameter corresponding to a target edge exposure unit of the wafer sample according to the second deviation amounts that respectively correspond to the n sampling points in the vertical direction may further include: removing the largest value and the smallest value in the second deviation amounts that respectively correspond to the n sampling points, and calculating an average of the remaining (n−2) second deviation amounts to obtain the second edge deviation amount parameter.

In the embodiments of this disclosure, the first edge deviation amount parameter and the second edge deviation amount parameter corresponding to a target exposure unit may be determined according to the following formulas:

$$x_{shot} = \frac{\sum_{i=1}^{n} x_i - x_{max} - x_{min}}{n-2} \quad (12)$$

$$y_{shot} = \frac{\sum_{i=1}^{n} y_i - y_{max} - y_{min}}{n-2},$$

where $x_{shot}$ represents the first edge deviation amount parameter corresponding to the target exposure units; $x_i$ represents a first deviation amount corresponding to any exposure unit in the target exposure units; $x_{max}$ represents the largest value in the n first deviation amounts; and $x_{min}$ represents the smallest value in the n first deviation amounts.

$y_{shot}$ represents the second edge deviation amount parameter corresponding to the target exposure units; $y_i$ represents a second deviation amount corresponding to any exposure unit in the target exposure units; $y_{max}$ represents the largest value in n second deviation amounts; and $y_{min}$ represents the smallest value in the n second deviation amounts.

In this way, the first edge deviation amount parameter and the second edge deviation amount parameter of a target edge exposure unit may also be calculated according to Formula (12); then a target deviation amount parameter corresponding to the target edge exposure unit is determined in combination with the machine deviation amount parameter, to compensate for the etching parameter. In addition, because the largest value and the smallest value are excluded during the calculation of an average, it can further be avoided that special excessively large or excessively small data leads to an inaccurate measurement result.

In some embodiments, the to-be-processed wafer may further include a plurality of non-edge exposure units. In the embodiments of this disclosure, an etching parameter of a non-edge exposure field may further be compensated for. In some embodiments, the method may further include the following operations.

A target deviation amount parameter corresponding to the non-edge exposure units of the to-be-processed wafer is determined, and the target deviation amount parameter includes a third target deviation amount parameter and a fourth target deviation amount parameter.

The first etching parameter of the non-edge exposure units of the to-be-processed wafer is compensated for with the third target deviation amount parameter to obtain the compensated first etching parameter.

The second etching parameter of the non-edge exposure units of the to-be-processed wafer is compensated for with the fourth target deviation amount parameter to obtain the compensated second etching parameter.

In a specific embodiment, for the third target deviation amount parameter and the fourth target deviation amount parameter, the method may further include: acquiring a first machine deviation amount parameter in a horizontal direction and a second machine deviation amount parameter in a vertical direction; and determining the first machine deviation amount parameter in the horizontal direction as the third target deviation amount parameter, and determining the second machine deviation amount parameter in the vertical direction as the fourth target deviation amount parameter.

It needs to be noted that, for the non-edge exposure units, the third target deviation amount parameter used for compensating for the first etching parameter is the first machine deviation amount parameter in the horizontal direction, and the fourth target deviation amount parameter used for compensating for the second etching parameter is the second machine deviation amount parameter in the vertical direction.

According to the method described in the foregoing embodiments, the compensated first etching parameter and the compensated second etching parameter corresponding to each exposure unit in the to-be-processed wafer sample may be obtained. It further needs to be supplemented that for edge exposure units, for reasons that, such as, different positions of an edge ring have different degrees of loss, the edge exposure units usually respectively correspond to different compensated first etching parameters and compensated second etching parameters. For non-edge exposure units, the machine deviation amount parameter is used for compensation, therefore non-edge exposure units correspond to the same compensated first etching parameter and compensated second etching parameter.

In this way, during patterning, compensation is performed on each exposure unit according to a preset deviation amount parameter in a direction opposite to the direction in which a capacitor of the exposure unit tilts (that is, for the edge exposure units, the first etching parameter is compensated for with the first target deviation amount parameter in the opposite direction, and the second etching parameter is compensated for with the second target deviation amount parameter in the opposite direction; and for the non-edge exposure units, the first etching parameter is compensated for with the third target deviation amount parameter in the opposite direction, and the second etching parameter is compensated for with the third target deviation amount parameter in the opposite direction).

In some embodiments, the etching the first mask layer according to a compensated first etching parameter, to form a first patterned layer extending in a first etching direction may include the following operations.

A photoresist layer is formed on a surface of the first mask layer.

The photoresist layer is etched according to the compensated first etching parameter to form a patterned photoresist layer extending in a first etching direction.

The first mask layer is etched with the patterned photoresist layer as a mask, to form the first patterned layer.

Figure 13:
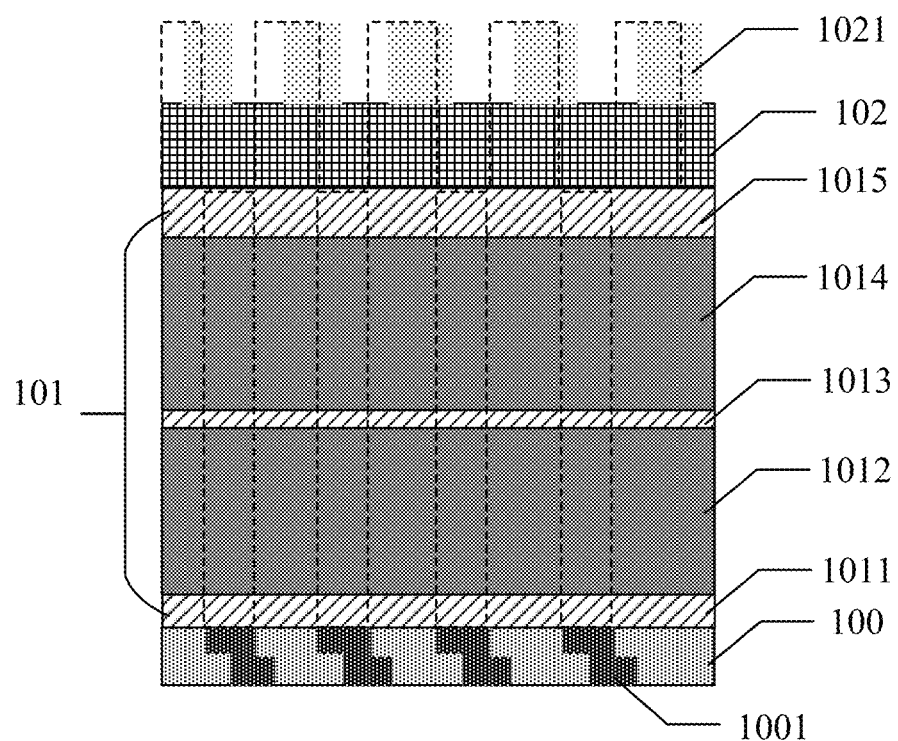
FIG. 13 is a partial schematic structural diagram of a to-be-processed wafer after a patterned photoresist layer is formed according to an embodiment of this disclosure.

As an example, FIG. 13 is a partial schematic structural diagram of a to-be-processed wafer after a patterned photoresist layer is formed according to an embodiment of this disclosure. As shown in FIG. 13, after a photoresist layer is formed on the surface of the first mask layer 102, the photoresist layer is etched according to the compensated first etching parameter, to form a patterned photoresist layers 1021 extending in the first etching direction, in which a plurality of openings is provided between the patterned photoresist layers 1021.

Figure 14:
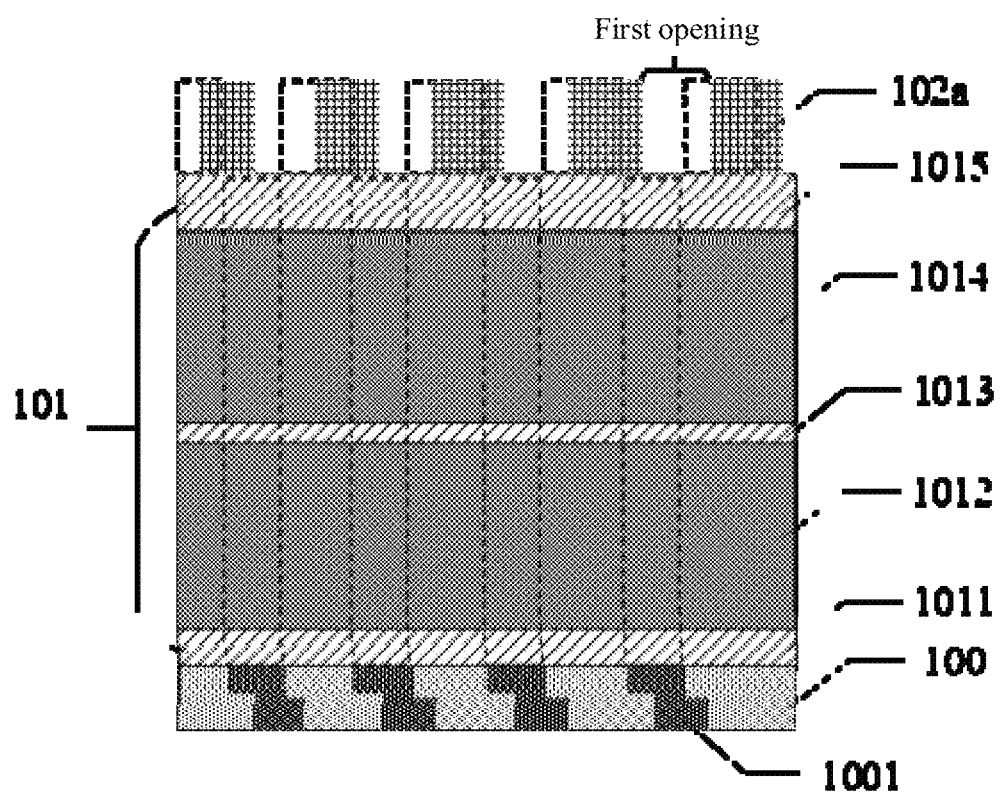
FIG. 14 is a partial schematic structural diagram of a to-be-processed wafer after a first patterned layer is formed according to an embodiment of this disclosure.

As an example in which the first patterned layer has been formed, FIG. 14 is a partial schematic structural diagram of a to-be-processed wafer after the first patterned layer is formed according to an embodiment of this disclosure. As shown in FIG. 14, the first mask layer 102 is etched with the patterned photoresist layer 1021 as a mask, thereby transferring a pattern in the patterned photoresist layer 1021 to the first mask layer 102, to form the first patterned layer. A plurality of first openings is defined by an etched first mask layer 102a. After the first patterned layer is formed, the patterned photoresist layer 1021 may be removed, for example by using an etching method.

In addition, in FIG. 13 and FIG. 14, a plurality of dash line boxes is further marked. These dash line boxes respectively represent positions of patterned photoresist layers and formed first etching patterns in a case that the first etching parameter is not compensated for. In this case, openings defined by the first etching patterns face the capacitor contact structures in the substrate. If no capacitor tilts, a capacitor via obtained through downward etching at this position may be butted with a capacitor contact structure. However, because a capacitor tilts, the eventually obtained capacitor via is shown in FIG. 3, in which the capacitor via cannot be successfully butted with the capacitor contact structure, to cause a product defect.

Figure 15:
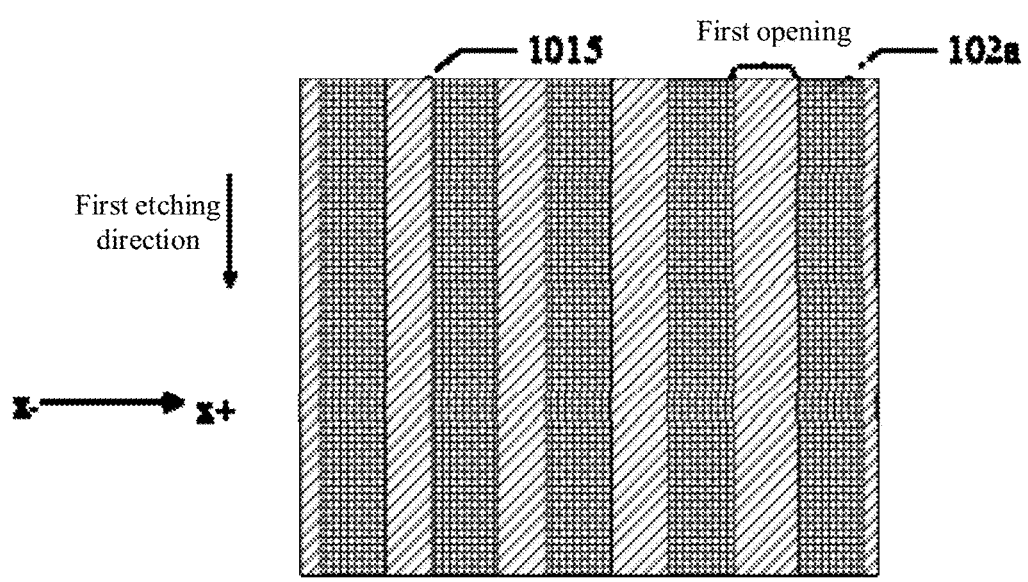
FIG. 15 is a partial schematic structural top view of a to-be-processed wafer after a first patterned layer is formed according to an embodiment of this disclosure.

As an example in which the first patterned layer has been formed, FIG. 15 is a partial schematic structural top view of a to-be-processed wafer after the first patterned layer is formed according to an embodiment of this disclosure. FIG. 14 is a sectional view of FIG. 15 in the first etching direction. As shown in FIG. 15, the first patterned layer includes the etched first mask layers 102a and the first openings defined by the etched first mask layers 102a. The etched first mask layer 102a and the first openings both extend in the first etching direction. In addition, it further needs to be noted that the first etching parameter in the first etching direction is compensated for according to the preset deviation amount parameter in the x direction. That is, if the capacitor deviates in the x+ direction, the first etching parameter is compensated for, to enable the formed first patterned layer to deviate in the x− direction by a distance of the preset deviation amount parameter.

In some embodiments, the etching the second mask layer and the second dielectric layer according to a compensated second etching parameter, to form a second patterned layer extending in a second etching direction may include the following operations.

The second mask layer is etched in a vertical direction according to a compensated second etching parameter, and the second dielectric layer continues to be etched in the vertical direction, to form the second patterned layer extending in the second etching direction.

Figure 16:
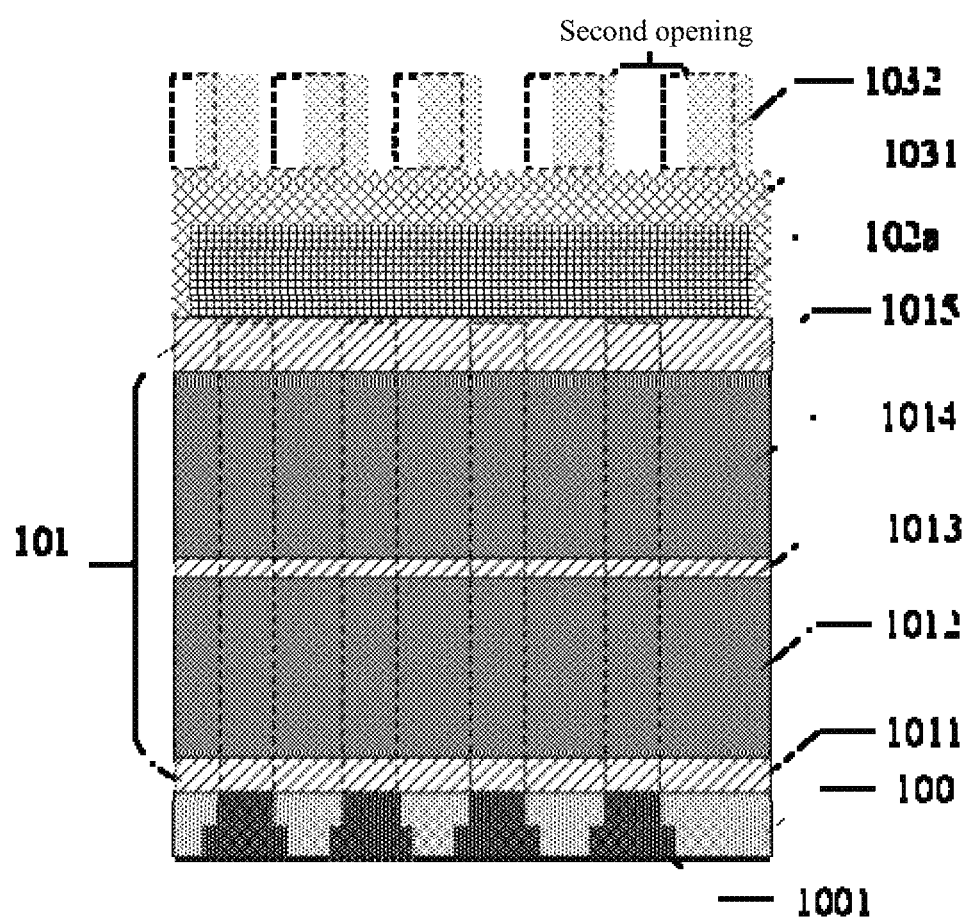
FIG. 16 is a partial schematic structural diagram of a to-be-processed wafer after a second patterned layer is formed according to an embodiment of this disclosure.

As an example, FIG. 16 is a partial schematic structural diagram of a to-be-processed wafer after a second patterned layer is formed according to an embodiment of this disclosure. A second dielectric layer 1031 and a second mask layer 1032 are formed on a surface of the first patterned layer, and then the second mask layer 1032 and the second dielectric layer 1031 are etched according to the compensated second etching parameter, to form the second patterned layer extending in the second etching direction.

The second mask layer 1032 may be a photoresist layer. A material of the second dielectric layer 1031 may be spin-coated carbon. The second mask layer 1032 is etched according to the compensated second etching parameter, and the second dielectric layer 1031 continues to be etched downward, to eventually obtain the second patterned layer extending in the second etching direction.

As shown in FIG. 16, a plurality of dash-line boxes is further marked. These dash-line boxes respectively represent positions of formed second etching patterns in a case that the second etching parameter is not compensated for. In this case, openings defined by the second etching patterns face the capacitor contact structures in the substrate. If no capacitor tilts, a capacitor via formed through downward etching at this position may be butted with a capacitor contact structure. However, because a capacitor tilts, the eventually formed capacitor via is shown in FIG. 3, in which the capacitor via cannot be successfully butted with the capacitor contact structure, to cause a product defect.

Figure 17:
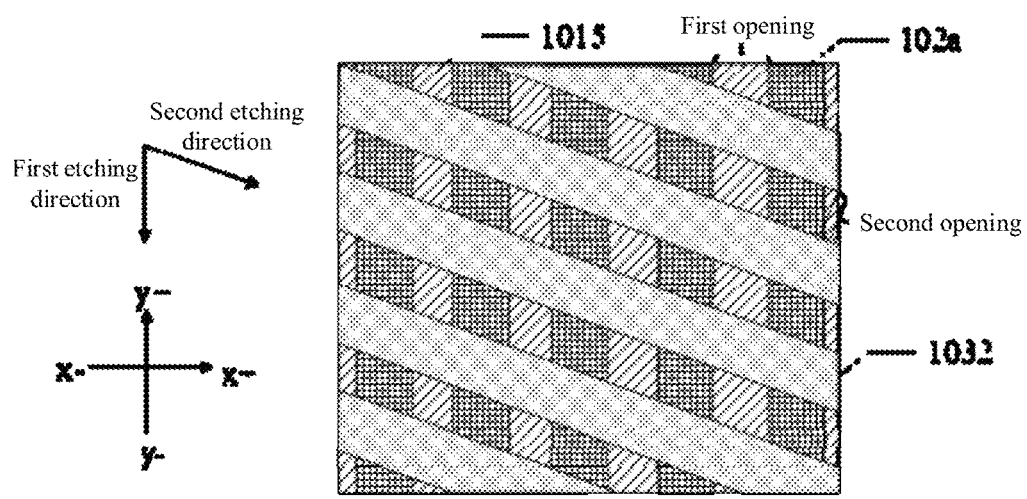
FIG. 17 is a partial schematic structural top view of a to-be-processed wafer after a second patterned layer is formed according to an embodiment of this disclosure.

As an example in which the second patterned layer has been formed, FIG. 17 is a partial schematic structural top view of a to-be-processed wafer after the second patterned layer is formed according to an embodiment of this disclosure. FIG. 16 is a sectional view of FIG. 17 in the first etching direction. As shown in FIG. 17, the second patterned layer formed after etching extends in the second etching direction. In addition, it further needs to be noted that the second etching parameter in the second etching direction is compensated for according to the preset deviation amount parameter in the y direction. That is, if the capacitor deviates in the y− direction, the second etching parameter is compensated for, to enable the formed second patterned layer to deviates in the y+ direction by a distance of the preset deviation amount parameter.

It needs to be noted that the first etching direction intersects the second etching direction. An included angle between the first etching direction and the second etching direction is not limited, and may be any appropriate angle such as 60° or 90°. In a specific example, as shown in FIG. 17, an included angle between the first etching direction and the second etching direction is 60°.

In S105, the first dielectric layer is etched with the first patterned layer and the second patterned layer together as a capacitor pattern, to form a capacitor via.

In the embodiments of this disclosure, overlapping regions of projections of the first patterned layer and the second patterned layer serve as a capacitor pattern. Intersecting regions of openings between the first patterned layers and openings between with the second patterned layers defines the position of the capacitor vias. In a process of etching the first dielectric layer to transfer the pattern downward, the shape of the openings may be corrected, to eventually form cylindrical capacitor vias.

Figure 18:
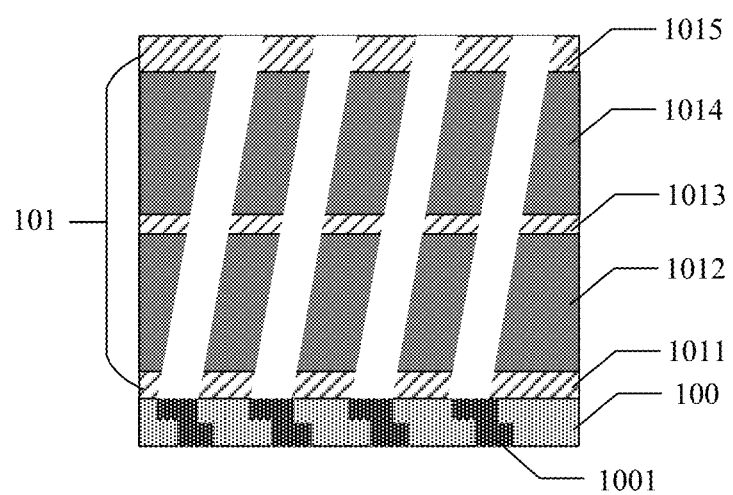
FIG. 18 is a partial schematic structural diagram of a to-be-processed wafer after a capacitor via is formed according to an embodiment of this disclosure.

FIG. 18 is a partial schematic structural diagram of a to-be-processed wafer after a capacitor via is formed according to an embodiment of this disclosure. As shown in FIG. 18, the first dielectric layer is etched with the first patterned layer and the second patterned layer together as a capacitor pattern, to form a capacitor via. As can be seen, although the capacitor via is still in a tilted state, compensation is performed in advance in an opposite direction of a direction in which a capacitor tilts, to enable the eventually obtained capacitor via to be successfully butted with the capacitor contact structure.

It further needs to be noted that, after the capacitor via is formed or in a process of forming the capacitor via, the second mask layer 1032, the second dielectric layer 1031, and the first mask layer 102a may further be removed at any appropriate time by using any known method in the art. This is not specifically defined in the embodiments of this disclosure.

Figure 19:
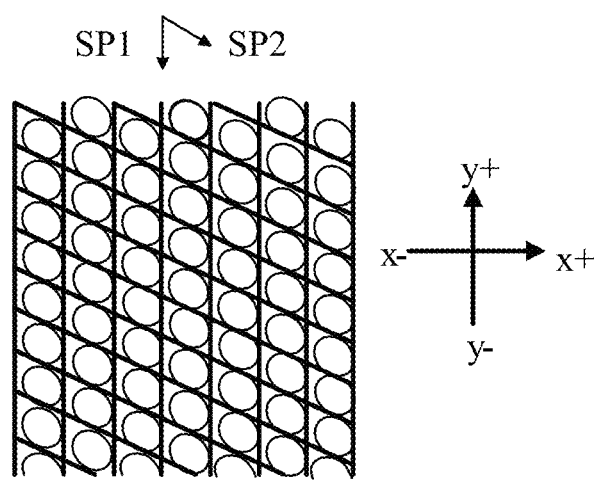
FIG. 19 is a schematic structural top view of a capacitor via according to an embodiment of this disclosure.

FIG. 19 is a schematic structural top view of a capacitor via according to an embodiment of this disclosure. SP1 is the first etching direction, SP2 is the second etching direction, and a circle represents a capacitor via.

Figure 20:
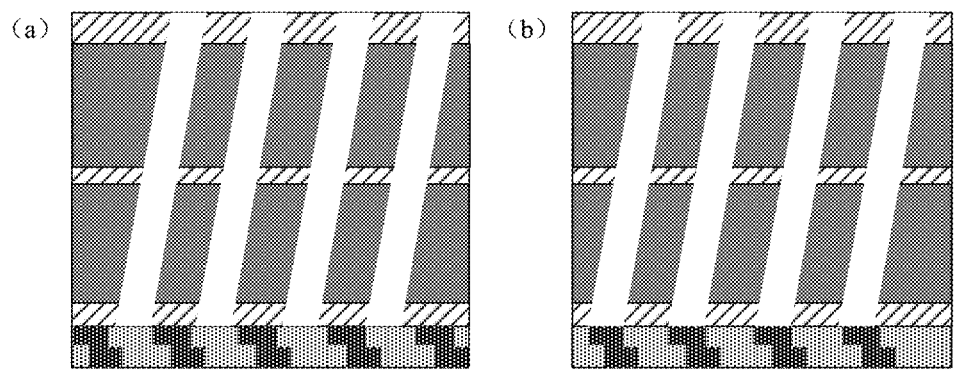
FIG. 20 is a schematic diagram of comparison between a capacitor via according to an embodiment of this disclosure and a capacitor via formed in the related art.

FIG. 20 is a schematic diagram of comparison between a capacitor via according to an embodiment of this disclosure and a capacitor via formed in the related art. (a) FIG. 20 is a schematic diagram of a capacitor via formed at an edge of a wafer in a case that the etching parameter is not compensated for in the related art. As can be seen, because a capacitor tilts, none of the capacitor vias is successfully butted with a capacitor contact structure. (b) FIG. 20 is a schematic diagram of a capacitor via formed at an edge of a wafer after the etching parameter is compensated for by using the method provided in the embodiments of this disclosure. As can be seen, the capacitor still tilts. However, compensation is performed in an opposite direction of the direction in which the capacitor tilts, to enable the eventually obtained capacitor via to be successfully butted with the capacitor contact structure.

In brief, embodiments of this disclosure provide a method for forming a capacitor via. A wafer in a reaction chamber at an RF final stage is selected. The shots at the outermost circle of the wafer is selected to perform polishing and slicing (a shot refers to a unit area of projection exposure once). In each shot, n points are selected to perform polishing and slicing until the bottom of a capacitor is reached. First deviation amounts $x_1, x_2, \ldots, x_n$, and second deviation amounts $y_1, y_2, \ldots, y_n$, of the selected points (that is, sampling points in the embodiments of this disclosure) in the horizontal direction and the vertical direction are then respectively measured and calculated. The largest value and the smallest value in deviation amounts of the n points are removed. The remaining values are averaged to calculate a first edge deviation amount parameter and a second edge deviation amount parameter of each shot in the x direction and the y direction that are respectively $x_{shot}$ and $y_{shot}$ $$x_{shot} = \frac{x_1 + x_2 + \ldots + x_n - x_{max} - x_{min}}{n-2},$$
$$y_{shot} = \frac{y_1 + y_2 + \ldots + y_n - y_{max} - y_{min}}{n-2},$$

and the first edge deviation amount parameter and the second edge deviation amount parameter of each shot may be calculated by using the same method.

Compensation is performed on one circle of shots at an edge of the wafer. A compensation of patterning in an SP1 direction (that is, the first patterned layer) in the x– direction or the x+ direction; and a compensation of patterning in an SP2 direction (that is, the second patterned layer) in the y– direction or the y+ direction are both performed in opposite directions of a deviation. Different products have different quantities of shots in the outermost circle of the wafer. A total quantity of shots in the outermost circle is defined as N. A first edge deviation amount and a second edge deviation amount in the x direction and the y direction corresponding to the first shot are respectively $x_{shot1}$ and $y_{shot1}$. A first edge deviation amount and a second edge deviation amount in the x direction and the y direction corresponding to an $N^{th}$ shot are respectively $x_{shotN}$ and $y_{shotN}$. OVL compensation includes two parts: a first edge deviation amount and a second edge deviation amount that are measured by a polished slice, and a first machine deviation amount $x_{ovl}$ and a second machine deviation amount $y_{ovl}$ in the x direction and the y direction that are measured and fed back by an OVL machine. In this case, for any edge shot, a first target deviation amount parameter and a second target deviation amount parameter of the edge shot in the x direction and the y direction are respectively: $x_i = k \times x_{wafer_i} + X_{ovl}$, $y_i = k \times y_{wafer_i} + y_{ovl}$, where k is a coefficient, defined in a range of 0 to 1; the RF period is 0 to T, the value of k and the RF period have a linear relationship: tt a time t, correspondingly $$k' = \frac{t}{T} \times k.$$

In this case, it is only necessary to replace k in the foregoing formula with k' to obtain a first target deviation amount parameter and a second target deviation amount parameter of an edge exposure unit at the time t. According to the length of the RF period, the first target deviation amount parameter and the second target deviation amount parameter of deviation amounts may be appropriately adjusted.

In this way, in a process of patterning an edge of a wafer to form a capacitor via, the transfer of the first patterned layer in the SP1 direction is compensated for in an opposite direction of a deviation, and the exposed pattern deviates in a direction of a deviation amount. The pattern is then transferred to a lower mask layer, that is, the first mask layer. The transfer of the second patterned layer in the SP2 direction is then compensated for in an opposite direction of a deviation, and the exposed patterning deviates in the direction of the deviation amount. The etching is further performed based on the pattern after OVL deviation compensation in the SP1 direction and the SP2 direction, to transfer the pattern downward. When being transferred to a capacitor contact structure, the pattern is successfully butted with the capacitor contact structure. Without the compensation of upper layer patterns in different directions, after a capacitor is transferred, the capacitor tends to fail to be butted with the capacitor contact structure, and there is a risk that the capacitor collapses to short-circuit the capacitor.

That is, in the wafer sample in the embodiments of this disclosure, by polishing to reach the bottom of a capacitor, deviation amounts of capacitor sections at different positions at an edge of a wafer relative to the capacitor contact structures are calculated. OVL is used to compensate for deviates in two directions of the deviation of the capacitor for a circle of shots at an edge of the wafer. Next, the pattern is transferred downwards. In this way, because of the compensation in the opposite direction at the bottom of the capacitor, a problem that a capacitor at an edge of the wafer tilts can be effectively mitigated. In addition, the embodiments of this disclosure can further improve a process window for a tilt of a capacitor.

Embodiments of this disclosure disclose a method for forming a capacitor via. The method includes: providing a to-be-processed wafer, the to-be-processed wafer including a substrate and a first dielectric layer and a first mask layer that are sequentially formed on a surface of the substrate; etching the first mask layer according to a compensated first etching parameter, to form a first patterned layer extending in a first etching direction; sequentially forming a second dielectric layer and a second mask layer on a surface of the first patterned layer; etching the second mask layer and the second dielectric layer according to a compensated second etching parameter, to form a second patterned layer extending in a second etching direction; and etching the first dielectric layer with the first patterned layer and the second patterned layer together as a capacitor pattern, to form a capacitor via. In this way, etching parameters are compensated for, so that during etching to form a capacitor via, a tilt of a capacitor via can be effectively mitigated, to improve a process window for a tilt of a capacitor, thereby improving the production yield.

Figure 21:
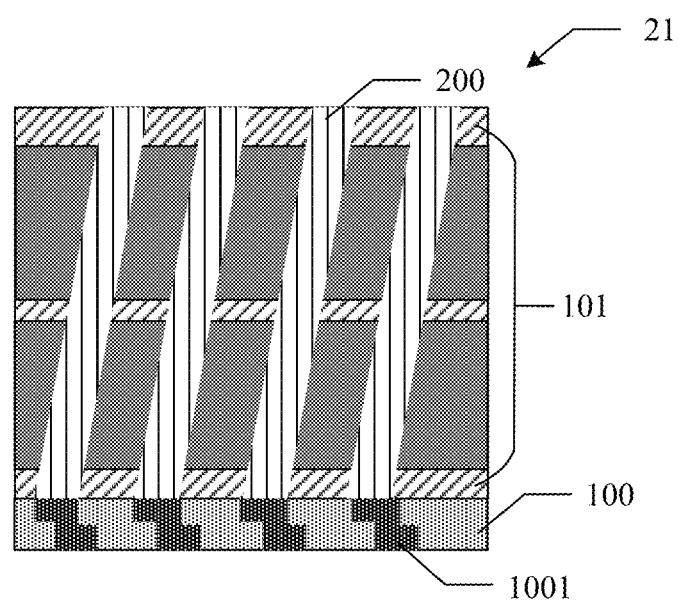
FIG. 21 is a schematic diagram of the component of a semiconductor structure according to an embodiment of this disclosure.

In another embodiment of this disclosure, FIG. 21 is a schematic diagram of the composition of a semiconductor structure 21 according to an embodiment of this disclosure. As shown in FIG. 21, the semiconductor structure 21 may include a substrate 100 and a first dielectric layer 101.

A capacitor contact structure 1001 is provided in the substrate 100.

The first dielectric layer 101 includes a capacitor structure 200 penetrating the first dielectric layer 101 and butted with the capacitor contact structure 1001, The capacitor structure 200 is formed in the capacitor via formed by using the method according to any one of the foregoing embodiments.

Specifically, after the capacitor via is formed by using the method in any one of the foregoing embodiments, a lower electrode plate, a capacitor dielectric layer, and an upper electrode plate may be further sequentially stacked in the capacitor via, to form the capacitor structure 200. For the semiconductor structure 21, the capacitor via configured for forming the capacitor structure 200 in the semiconductor structure 21 is formed by using the method according to the foregoing embodiments, so that the capacitor structure 200 is successfully butted with the capacitor contact structure 1001, to avoid a risk that a capacitor collapses to short-circuit the capacitor.

Figure 22:
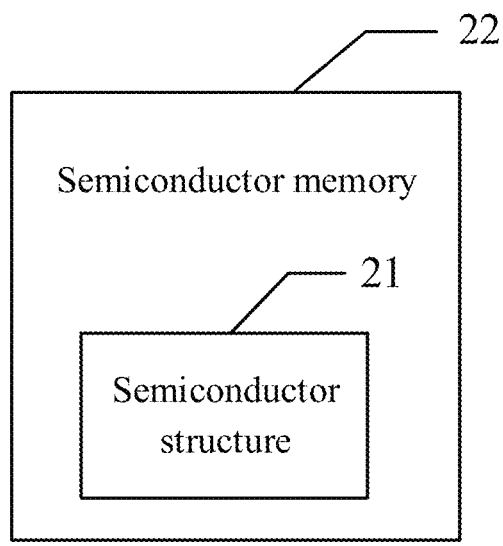
FIG. 22 is a schematic diagram of the component of a semiconductor memory according to an embodiment of this disclosure.

In still another embodiment of this disclosure, FIG. 22 is a schematic diagram of the composition of a semiconductor memory 22 according to an embodiment of this disclosure. As shown in FIG. 22, the semiconductor memory 22 may include the semiconductor structure 21 in the foregoing embodiments.

In some embodiments, the semiconductor memory 22 may be a DRAM.

In the embodiments of this disclosure, for the semiconductor memory 22, the capacitor structure and the capacitor contact structure in the semiconductor structure 21 included in the semiconductor memory 22 are successfully butted, thereby avoiding a risk that a capacitor collapses to short-circuit the capacitor.

The foregoing is merely preferred embodiments of this disclosure but is not used to limit the scope of protection of this disclosure.

It should be noted that the terms "include", "comprise", or any variation thereof in this disclosure are intended to cover a non-exclusive inclusion. Therefore, a process, method, object or apparatus that includes a series of elements not only includes such elements, but also includes other elements not specified expressly, or may include inherent elements of the process, method, object or apparatus. If no more limitations are made, an element limited by "include a/an . . . " does not exclude other same elements existing in the process, the method, the object or the apparatus which includes the element.

The foregoing sequence numbers of embodiments of this disclosure are merely for the convenience of description, and do not imply the preference among the embodiments.

The methods disclosed in several method embodiments provided in this disclosure may be arbitrarily combined with each other without causing any conflict to obtain new method embodiments.

The features disclosed in several product embodiments provided in this disclosure may be arbitrarily combined with each other without causing any conflict to obtain new product embodiments.

The features disclosed in several method or device embodiments provided in this disclosure may be arbitrarily combined with each other without causing any conflict to obtain new method embodiments or device embodiments.

The foregoing descriptions are merely specific embodiments of this disclosure, but are not intended to limit the scope of protection of this disclosure. Any variation or replacement that may be readily figured out by a person skilled in the art within the technical scope disclosed in this disclosure shall fall within the scope of protection of this disclosure. Therefore, the scope of protection of this disclosure shall be subject to the scope of protection of the claims.

INDUSTRIAL APPLICABILITY

In the embodiments of this disclosure, A to-be-processed wafer is provided, the to-be-processed wafer including a substrate and a first dielectric layer and a first mask layer that are sequentially formed on a surface of the substrate. The first mask layer is etched according to a compensated first etching parameter, to form a first patterned layer extending in a first etching direction. A second dielectric layer and a second mask layer are sequentially formed on a surface of the first patterned layer. The second mask layer and the second dielectric layer are etched according to a compensated second etching parameter, to form a second patterned layer extending in a second etching direction. The first dielectric layer is etched with the first patterned layer and the second patterned layer together as a capacitor pattern, to form a capacitor via. In this way, etching parameters are compensated for, so that during etching to form a capacitor via, a tilt of a capacitor via can be effectively mitigated, to improve a process window for a tilt of a capacitor, thereby improving the production yield.

The invention claimed is:

1. A method for forming a capacitor via, comprising:
providing a to-be-processed wafer, the to-be-processed wafer comprising a substrate, and a first dielectric layer and a first mask layer that are sequentially formed on a surface of the substrate;
forming a photoresist layer on a surface of the first mask layer;
etching the photoresist layer in a vertical direction according to a compensated first etching parameter to form a patterned photoresist layer extending in a first etching direction;
etching the first mask layer with the patterned photoresist layer as a mask to form the first patterned layer;
sequentially forming a second dielectric layer and a second mask layer on a surface of the first patterned layer;
etching the second mask layer and the second dielectric layer according to a compensated second etching parameter to form a second patterned layer extending in a second etching direction; and
etching the first dielectric layer with the first patterned layer and the second patterned layer together as a capacitor pattern, to form a capacitor via.

2. The method according to claim 1, wherein
a capacitor contact structure is provided in the substrate, and the capacitor via is butted with the capacitor contact structure.

3. The method according to claim 1, further comprising:
compensating for the first etching parameter and the second etching parameter of the to-be-processed wafer with a preset deviation amount parameter to obtain the compensated first etching parameter and the compensated second etching parameter.

4. The method according to claim 3, wherein
the etching the second mask layer and the second dielectric layer according to the compensated second etching parameter to form the second patterned layer extending in the second etching direction comprises:
etching the second mask layer in a vertical direction with the compensated second etching parameter, and continuously etching the second dielectric layer in the vertical direction to form the second patterned layer extending in the second etching direction.

5. The method according to claim 3, further comprising:
acquiring an edge deviation amount parameter of a wafer sample and a machine deviation amount parameter at a radio frequency (RF) final stage; and
determining the preset deviation amount parameter according to the edge deviation amount parameter of the wafer sample and the machine deviation amount parameter.

6. The method according to claim 5, wherein
the determining the preset deviation amount parameter according to the edge deviation amount parameter of the wafer sample and the machine deviation amount parameter comprises:
determining an adjusted deviation amount value according to an RF period and a current time;
determining a calculated deviation amount value by using a preset calculation model according to the edge deviation amount parameter of the wafer sample and the machine deviation amount parameter; and
correcting the calculated deviation amount value with the adjusted deviation amount value to obtain the preset deviation amount parameter.

7. The method according to claim 3, wherein
the to-be-processed wafer comprises a plurality of edge exposure units, wherein the edge exposure units respectively correspond to different preset deviation amount parameters;
the method further comprises:
determining a target deviation amount parameter corresponding to a target edge exposure unit of the to-be-processed wafer, the target deviation amount parameter comprising a first target deviation amount parameter and a second target deviation amount parameter; and
wherein the compensating for the first etching parameter and the second etching parameter of the to-be-processed wafer with the preset deviation amount parameter to obtain the compensated first etching parameter and the compensated second etching parameter comprises:
compensating for a first etching parameter of the target edge exposure unit with the first target deviation amount parameter to obtain the compensated first etching parameter; and
compensating for a second etching parameter of the target edge exposure unit with the second target deviation amount parameter, to obtain the compensated second etching parameter.

8. The method according to claim 7, further comprising:
acquiring a first edge deviation amount parameter corresponding to a target edge exposure unit of a wafer sample and a first machine deviation amount parameter in a horizontal direction at a RF final stage; and
determining the first target deviation amount parameter according to the first edge deviation amount parameter and the first machine deviation amount parameter; and
acquiring a second edge deviation amount parameter corresponding to the target edge exposure unit of the wafer sample and a second machine deviation amount parameter in a vertical direction at the RF final stage; and
determining the second target deviation amount parameter according to the second edge deviation amount parameter and the second machine deviation amount parameter.

9. The method according to claim 8, further comprising:
randomly selecting n sampling points from the target edge exposure unit of the wafer sample;
determining first deviation amounts that respectively correspond to the n sampling points in the horizontal direction and second deviation amounts that respectively correspond to the n sampling points in the vertical direction;
determining the first edge deviation amount parameter corresponding to the target edge exposure unit of the wafer sample according to the first deviation amounts that respectively correspond to the n sampling points in the horizontal direction; and
determining the second edge deviation amount parameter corresponding to the target edge exposure unit of the wafer sample according to the second deviation amounts that respectively correspond to the n sampling points in the vertical direction.

10. The method according to claim 9, wherein
the randomly selecting n sampling points from the target edge exposure unit of the wafer sample comprises:
slicing the target edge exposure unit of the wafer sample, to obtain a slice of the target edge exposure unit, the slice comprising the n sampling points, and each sampling point comprising a capacitor contact structure and a capacitor section.

11. The method according to claim 10, wherein
the determining first deviation amounts that respectively correspond to the n sampling points in the horizontal direction comprises:
measuring a first positive distance and a first negative distance between a capacitor contact structure and a capacitor section in a first sampling point; and
calculating a first deviation amount of the first sampling point according to the first positive distance and the first negative distance of the first sampling point; and
the determining second deviation amounts that respectively correspond to the n sampling points in the vertical direction comprises:
measuring a second positive distance and a second negative distance between the capacitor contact structure and the capacitor section in the first sampling point; and
calculating a second deviation amount of the first sampling point according to the second positive distance and the second negative distance of the first sampling point,
wherein the first sampling point represents any sampling point in the n sampling points.

12. The method according to claim 11, wherein
responding to the capacitor section does not deviate beyond an edge of the capacitor contact structure, the calculating the first deviation amount of the first sampling point and the second deviation amount of the first sampling point comprises:
determining one second of a difference between the first positive distance and the first negative distance of the first sampling point as the first deviation amount of the first sampling point; and
determining one second of a difference between the second positive distance and the second negative distance of the first sampling point as the second deviation amount of the first sampling point.

13. The method according to claim 11, wherein
responding to the capacitor section deviates beyond an edge of the capacitor contact structure, the calculating the first deviation amount of the first sampling point and the second deviation amount of the first sampling point comprises:
determining one second of a sum of the first positive distance and the first negative distance of the first sampling point as the first deviation amount of the first sampling point; and
determining one second of a sum of the second positive distance and the second negative distance of the first sampling point as the second deviation amount of the first sampling point.

14. The method according to claim 9, wherein
the determining the first edge deviation amount parameter corresponding to the target edge exposure unit of the wafer sample and the second edge deviation amount parameter corresponding to the target edge exposure unit of the wafer sample comprises:
removing a largest value and a smallest value in n first deviation amounts according to the first deviation amounts that respectively correspond to the n sampling points in the horizontal direction, and calculating an average of remaining (n−2) first deviation amounts to obtain the first edge deviation amount parameter; and
removing a largest value and a smallest value in n second deviation amounts according to the second deviation amounts that respectively correspond to the n sampling points in the vertical direction, and calculating an average of remaining (n−2) second deviation amounts to obtain the second edge deviation amount parameter.

15. The method according to claim 7, wherein
the to-be-processed wafer further comprises a plurality of non-edge exposure units; and the method further comprises:
determining target deviation amount parameters corresponding to a non-edge exposure unit of the to-be-processed wafer, the target deviation amount parameter comprising a third target deviation amount parameter and a fourth target deviation amount parameter; and
the compensating for the first etching parameter and the second etching parameter of the to-be-processed wafer with the preset deviation amount parameter to obtain the compensated first etching parameter and the compensated second etching parameter comprises:
compensating for a first etching parameter of the non-edge exposure unit of the to-be-processed wafer with the third target deviation amount parameter to obtain the compensated first etching parameter; and
compensating for a second etching parameter of the non-edge exposure unit of the to-be-processed wafer with the fourth target deviation amount parameter to obtain the compensated second etching parameter.

16. The method according to claim 15, further comprising:
acquiring a first machine deviation amount parameter in a horizontal direction and a second machine deviation amount parameter in a vertical direction; and
determining the first machine deviation amount parameter in the horizontal direction as the third target deviation amount parameter, and determining the second machine deviation amount parameter in the vertical direction as the fourth target deviation amount parameter.

\* \* \* \* \*